US009023669B2

(12) United States Patent
Hiramoto et al.

(10) Patent No.: US 9,023,669 B2
(45) Date of Patent: May 5, 2015

(54) PROCESSING METHOD OF SILICON SUBSTRATE AND LIQUID EJECTION HEAD MANUFACTURING METHOD

(75) Inventors: Atsushi Hiramoto, Machida (JP); Masahiko Kubota, Tokyo (JP); Ryoji Kanri, Zushi (JP); Akihiko Okano, Fujisawa (JP); Yoshiyuki Fukumoto, Kawasaki (JP); Atsunori Terasaki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 688 days.

(21) Appl. No.: 13/186,740

(22) Filed: Jul. 20, 2011

(65) Prior Publication Data

US 2012/0028383 A1 Feb. 2, 2012

(30) Foreign Application Priority Data

Jul. 27, 2010 (JP) ................................ 2010-167909

(51) Int. Cl.
*H01L 21/3065* (2006.01)
*B41J 2/16* (2006.01)

(52) U.S. Cl.
CPC .............. *B41J 2/1603* (2013.01); *B41J 2/1629* (2013.01); *B41J 2/1631* (2013.01); *H01L 21/30655* (2013.01)

(58) Field of Classification Search
CPC .................... H01L 21/02288; H01L 21/6715; H01L 21/67126; H01L 51/0005; H01L 51/0004
USPC .......................................................... 438/21
See application file for complete search history.

(56) References Cited

U.S. PATENT DOCUMENTS

| | | | | |
|---|---|---|---|---|
| 6,019,907 | A * | 2/2000 | Kawamura | 216/27 |
| 6,468,437 | B1 | 10/2002 | Kashino et al. | |
| 6,521,137 | B2 | 2/2003 | Kubota et al. | |
| 6,534,247 | B2 | 3/2003 | Milligan et al. | |
| 2010/0134560 | A1 * | 6/2010 | Doi et al. | 347/47 |
| 2010/0255616 | A1 | 10/2010 | Kokubo et al. | |

FOREIGN PATENT DOCUMENTS

| | | |
|---|---|---|
| JP | 10-146979 A | 6/1998 |
| JP | 2009-137155 A | 6/2009 |

* cited by examiner

*Primary Examiner* — Daniel Whalen
*Assistant Examiner* — Suberr Chi
(74) *Attorney, Agent, or Firm* — Fitzpatrick, Cella, Harper & Scinto

(57) ABSTRACT

A processing method of a silicon substrate including forming a second opening in a bottom portion of a first opening using a patterning mask having a pattern opening by plasma reactive ion etching. The reactive ion etching is performed with a shield structure formed in or on the silicon substrate, the shield structure preventing inside of the first opening from being exposed to the plasma.

32 Claims, 14 Drawing Sheets

15
FIG. 2A
FIG. 2B
FIG. 2C
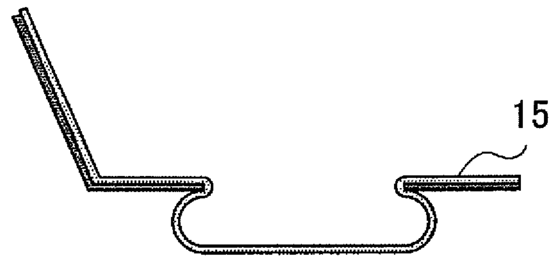
FIG. 2D
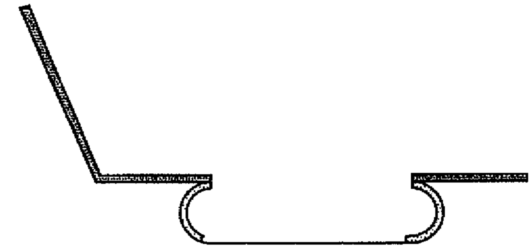
FIG. 2E
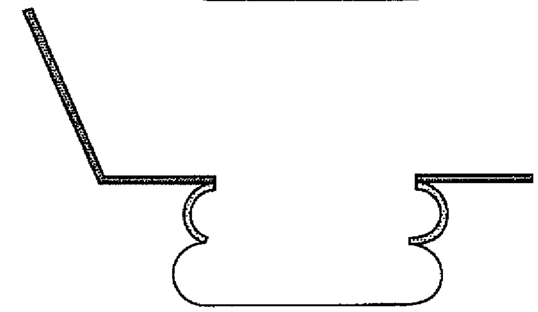
FIG. 2F

PROCESSING METHOD OF SILICON SUBSTRATE AND LIQUID EJECTION HEAD MANUFACTURING METHOD

BACKGROUND OF THE INVENTION

1. Field of the Invention

The present invention relates to a processing method of a silicon substrate.

2. Description of the Related Art

Currently, a microfabrication technique for semiconductor devices is applied to process a silicon substrate for a liquid ejection head. Further, there is a need in recent liquid ejection recording apparatuses for improvement in printing performance such as high-resolution and high-speed printing. Accordingly, a more accurate placement of ejected droplets and a higher-speed liquid refilling are required.

As disclosed in Japanese Patent Application Laid-Open No. H10-146979, a common liquid ejection head for use in a liquid ejection printing system is provided on a silicon substrate which includes thereon a fine ejection orifice for ejecting droplets; a liquid flow path communicatively connected to the ejection orifice; an ejection energy generating unit disposed in a part of the liquid flow path. Further, the silicon substrate includes a common liquid chamber communicatively connected to the liquid flow path.

Further, another liquid ejection head is developed as disclosed in Japanese Patent Application Laid-Open No. 2009-137155. In the liquid ejection head disclosed in Japanese Patent Application Laid-Open No. 2009-137155, liquid flow paths communicatively connected to one ejection orifice are arranged symmetrically with the ejection orifice. Such a configuration allows the generated bubbles to grow equally on the left and right liquid flow paths. Thus, the droplets can be stably ejected from the ejection orifice in a perpendicular direction and can be accurately placed.

Specific examples of the method of forming the aforementioned liquid ejection head formed on a silicon substrate having a plurality of supply ports communicatively connected to a common liquid chamber include a method of performing the two etch step process on the silicon substrate as disclosed in U.S. Pat. No. 6,534,247. According to U.S. Pat. No. 6,534,247, first, a first crystal anisotropic etching is performed to form a depressed portion to form a common liquid chamber. Then, a second dry etching is performed on a bottom surface of the depressed portion to form a plurality of supply ports. Thus, the silicon substrate has a plurality of supply ports communicatively connected to a common liquid chamber formed in the depressed portion.

SUMMARY OF THE INVENTION

The present invention is a processing method of a silicon substrate of forming a second opening in a bottom portion of a first opening using a patterning mask having a pattern opening by plasma reactive ion etching. The reactive ion etching is performed with a shield structure formed in or on the silicon substrate, the shield structure preventing inside of the first opening from being exposed to the plasma.

Further, the present invention relates to a process for producing a liquid ejection head including forming a supply port as the second opening on a bottom surface of a common liquid chamber as the first opening using the aforementioned processing method of a silicon substrate.

Further features of the present invention will become apparent from the following description of exemplary embodiments with reference to the attached drawings.

BRIEF DESCRIPTION OF THE DRAWINGS

FIGS. 2A, 2B, 2C, 2D, 2E and 2F are schematic views for describing a conventional problem to be solved to form a second depressed portion using dry etching.

DESCRIPTION OF THE EMBODIMENTS

Preferred embodiments of the present invention will now be described in detail in accordance with the accompanying drawings.

Figure 8A:
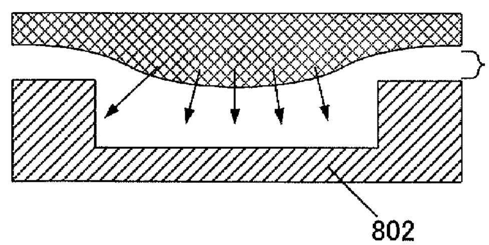
FIGS. 8A, 8B and 8C are schematic views for describing plasma molding effect.

One of the methods of forming a supply port for use in a liquid ejection head includes dry etching, and particularly dry etching using the Bosch process is desirable. The dry etching using the Bosch process is a technique for vertically etching a silicon substrate by repeating a deposited film forming process, a removing process for a deposited film except a side surface thereof by ions, and a radical etching process. In this process, when a supply port is formed by dry-etching a bottom surface of the depressed portion, a supply port in the vicinity of a side wall of the depressed portion is etched in an inclined direction toward the side wall of the depressed portion. This phenomenon is caused by a principle called the plasma molding effect. When plasma etching is performed, generally a region referred to as a plasma sheath (or simply referred to as a sheath) is formed by using the substrate surface as an equipotential surface. A negative potential difference occurs in the sheath on the basis of the plasma. Thus, ions are accelerated toward the substrate from the plasma through the sheath. Therefore, the ions are vertically accelerated toward an equipotential surface of the sheath, namely, toward the substrate. However, if the substrate surface has a large depressed portion, a sheath 801 is formed along irregularities of a substrate 802 as illustrated in FIG. 8A. Positive ions are vertically accelerated toward the equipotential surface of the sheath. Thus, the ion track is bent toward the side wall of the depressed portion. This phenomenon is considered to be applied to supply port etching. "The removing process for a deposited film except a side surface thereof by ions" is performed by the ions accelerated by the sheath. Therefore, in the vicinity of the side wall of the depressed portion, the ions which remove the deposited film are affected by the sheath, and a deposited film located in a position shifted from a desired position is removed. Thus, on the bottom surface of depressed portion, the position of removing the deposited film is continuously shifted, and the position of the radical etching is also continuously shifted. As a result, there is a problem in that etching proceeds with several degrees of angle. Such a problem is not limited to the Bosch process, but is common to dry etching of a general reactive ion etching (RIE).

If the etching proceeds with several degrees of angle, an opening in an etching start region of the obtained supply port and an opening in an etching end region thereof are positionally shifted in a horizontal direction. Accordingly, a positional shift of the opening (the opening of the etching end region) of the supply port occurs on a surface of the silicon substrate. As a result, an adjacent wiring portion may be damaged. Since an inclined supply port is formed, the inclined supply port is longer than the other supply ports, which may cause variations in supply performance. Further, an uncompleted supply port may sometimes be formed.

In view of this, it is an object of the present invention to provide a processing method of a silicon substrate capable of providing an opening perpendicular to a surface facing a surface having a depressed portion from a bottom portion of the depressed portion in the silicon substrate using dry etching. More preferably, it is an object of the present invention to provide a processing method of a silicon substrate capable of forming a plurality of supply ports with a high opening positional accuracy by vertically dry-etching a bottom portion of a common liquid chamber formed of the depressed portion of the silicon substrate.

A sheath forms through the difference in mobility of electrons and ions. When the plasma has therein a boundary region such as a chamber wall and a substrate, electrons with a small mass first reach the boundary region to form a negative potential relative to the plasma. Then, so as to block this, a region with a large amount of positive charges is formed to balance positive and negative charges. This region is referred to as a sheath formed so as to be parallel to the interface as an equipotential surface. Further, when bias power is applied to the substrate, the negative potential of the substrate is increased and ion-inducing energy is also increased. Making use of this is referred to as a reactive ion etching.

The Bosch process is one mode of the reactive ion etching. As illustrated in FIGS. 2A to 2C, vertical etching is performed by continuously repeating (1) forming a CF-based deposited film 15, (2) removing the deposited film 15 by ions, and (3) etching mainly with F-based radical.

In (2), positive ions in the plasma are accelerated toward the substrate surface by the sheath to proceed the deposited film etching.

Here, as illustrated in FIG. 2D, when etching is performed on a bottom surface of the depressed portion having a side surface with an obtuse angle relative to the bottom surface, the aforementioned plasma molding effect causes the sheath to be formed along the shape of the depressed portion. This is because the sheath forms an equipotential surface obtained by integrating the positions spaced at a certain distance from the substrate surface as the equipotential surface. Thus, the positive ions are accelerated toward the substrate with several degrees of angle. As a result, a part of the deposited film 15 on the side wall is etched, and the etching in (3) may proceed with a lateral shift. As a result of such repeated process, the etching proceeds with several degrees of angle (FIGS. 2D to 2F).

More specifically, taking an example of forming a supply port in a bottom surface of a common liquid chamber, the sheath is formed along the shape of the common liquid chamber. In the supply port to be formed in the vicinity of the side surface of the common liquid chamber, the ions are affected by the sheath formed on the side surface of the common liquid chamber, and the etching may proceed not in a direction perpendicular to the substrate but in a side surface direction with several degrees of angle.

Figure 8B:
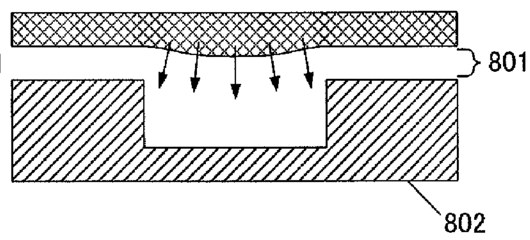

The plasma molding effect depends on the correlation between the length of the sheath and the opening size of the depressed portion. The plasma molding effect starts to appear when (length of the sheath)/(opening size of the depressed portion)≤about 10. More specifically, if the length of the sheath is the same, for example, as illustrated in FIGS. 8A and 8B for comparison, a reduction in the opening size of the depressed portion is considered to reduce the plasma molding effect.

Figure 8C:
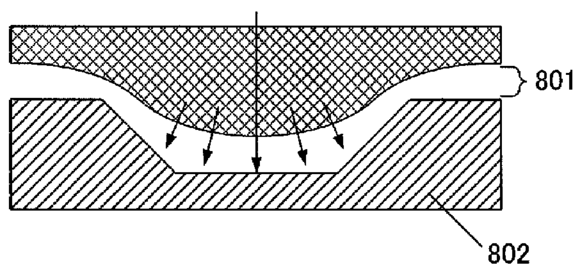

If the opening size is the same, the more inclined toward the inside of the opening the side surface is, the more remarkable the plasma molding effect is. This is because as illustrated in FIGS. 8A and 8C for comparison, the more obtuse the angle between the side surface and the bottom surface of the opening, the more easily the sheath 801 follows the shape of the opening of the substrate 802. In this case, for example, the plasma molding effect can be reduced by blocking at least part of the inclined side wall.

Thus, the present invention has a common liquid chamber with a reduced area exposed to the plasma, thereby suppressing the plasma molding effect and abating the sheath deformation, and then a second depressed portion is formed on a bottom surface of a first depressed portion by reactive ion etching. Thus, the second depressed portion such as the supply port can be formed perpendicularly relative to the surface direction of the silicon substrate even in the vicinity of the side surface. The process of blocking the inclined side surface is included in the concept that the common liquid chamber has a reduced area exposed to the plasma.

Thus, the present invention is a processing method of a silicon substrate including a second opening in a bottom portion of a first opening using a patterning mask having a pattern opening by plasma reactive ion etching. Further, the present invention performs the reactive ion etching in a state in which a shield structure for preventing inside of the first opening from being exposed to the plasma is formed in or on the silicon substrate. Furthermore, the shield structure does not prevent the pattern opening from being exposed to the plasma.

Note that the above description takes an example of dry etching using the Bosch process, but the present invention is not limited to the Bosch process.

First Embodiment

An embodiment of the present invention includes a method of forming a shield on a silicon substrate so as to cover at least part of an inclined side surface in a configuration in which a side surface of a common liquid chamber is inclined. More specifically, a shield for preventing a sheath from being formed along the inclined side surface of the common liquid chamber is formed on the substrate. Thereby, a supply port (the second depressed portion) can be formed perpendicularly to the bottom surface of the common liquid chamber (the first depressed portion) by dry etching. In this method, the shield is formed on the substrate, and an opening portion can be secured at a high positional accuracy. Thus, the portion to be shielded is easier to be controlled. Further, the gap between the substrate and the shield is small, which increases the shielding effect.

Figure 9A:
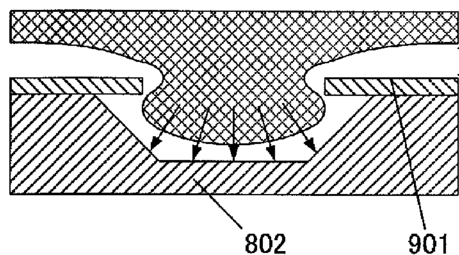
FIGS. 9A and 9B are schematic views for describing plasma molding effect in the presence of a shield.
Figure 9B:
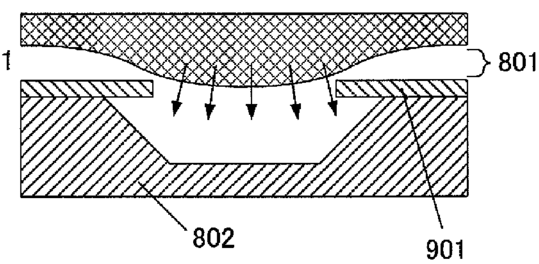

More specifically, in the above process (2), when a shield is formed so as to cover at least part of the inclined side surface of the common liquid chamber, the shield serves as an equipotential surface with respect to the substrate. In general, a sheath is formed several hundred μm to several mm long depending on the plasma conditions. The common liquid chamber is, for example, 0.2 mm to 0.9 mm deep, and the shield is slightly shorter than this depth size. Consequently, the depth of the common liquid chamber, the length of the shield and the length of the sheath are about the same size. Thus, as illustrated in FIG. 9A, it is difficult to form the sheath extending immediately under the shield 901. In other word, as illustrated in FIG. 9B, the sheath is formed such that the position of the shield is almost equal to the position of the opening of the vertical depressed portion. Consequently, the sheath deformation is abated and ions are not accelerated in a direction of the side surface of the depressed portion. Thus, when the supply ports are etched, a part of the deposited film of the side wall is less etched. Therefore, the etching in (3) proceeds without a lateral shift, and the supply ports can be formed perpendicularly to the bottom surface of the common liquid chamber. Note that the present invention has an effect as long as at least part of the inclined side surface is blocked.

The silicon substrate has a first surface and a second surface opposite to the first surface, and a first depressed portion such as a common liquid chamber is formed on the second surface. As for the method of forming the first depressed portion on the second surface, a crystal anisotropic etching can be used.

The first depressed portion has an inclined side surface, and the angle between the side surface and the bottom surface is an obtuse angle ($90° < \theta < 180°$).

The dry etching is performed under a high frequency for applying a bias to the silicon substrate. For example, a general RIE dry etching using an ECR or an ICP as the plasma source can be used.

The dry etching is performed using a shield formed on the silicon substrate and a patterning mask having a pattern opening formed on the bottom surface of the first depressed portion. For example, the pattern opening can be provided in a position to form a supply port.

The shield can be made of, for example, a resist mask formed on the second surface so as to spread on an opening surface of the first depressed portion.

Further, the shield is formed on a silicon substrate such that a shadow formed by irradiation of light perpendicular to the second surface toward the first depressed portion covers at least part of the depressed portion side surface but the shadow is not formed in the pattern opening.

According to the present embodiment, the shield has an effect when the shadow is formed so as to cover at least part of depressed portion side surface, but the shadow is preferably formed so as to cover the entire depressed portion side surface.

The shield can be formed of a film photosensitive resist that is applied to the second surface and is patterned by photolithography. Alternatively, the shield can be formed by attaching a patterned shield-shaped structure to the second surface.

Figure 10:
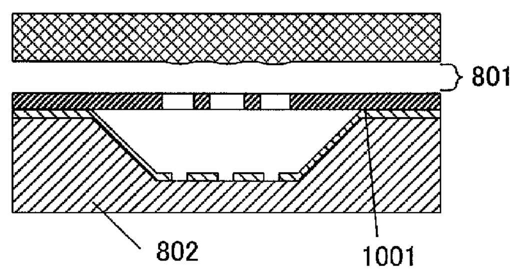
FIG. 10 is a schematic view for describing plasma molding effect in the presence of a shield.

Effective shield shapes include an eaves shape, a protrusion shape and a cliff shape, but the shapes are not limited to these, and any shape may be used as long as the shape can suppress the plasma molding effect. For example, a shape bridging the first depressed portion is effective in preventing the shield deformation. Further, from the point of view of minimizing the common liquid chamber area exposed to the plasma as much as possible, for example, as illustrated in FIG. 10, only the minimum region containing the portion of forming a supply port is opened and a shield 1001 may entirely remain in the other regions. Consequently, the sheath over the common liquid chamber is substantially parallel to the substrate and ions are accelerated perpendicularly to the substrate. The states range from the state of blocking at least part of the inclined side surface to the state of opening the shield only over the supply port are included in the examples of the present embodiment.

Specific examples of the method of forming the shield include a method of laminating a filmy resin having an opening formed so as not to block the etching portion in the bottom surface of the first depressed portion in the common liquid chamber and the like. In addition, the examples of the method include a method of laminating a filmy resin and then forming an opening by etching or the like. Note that the method is not limited to these, but any method may be used as long as the method can form a shape blocking the depressed portion side surface.

The materials of the shield are not particularly limited, but a resist can be used and a photosensitive resist can be used.

Hereinafter, a method of forming the shield will be specifically described.

When a resist pattern is formed on a bottom surface of the common liquid chamber and then the shield is formed, the shield can be formed by an organic film as represented by a dry film resist because of ease of forming a pattern and attaching to the substrate. Examples of a commercially available dry film resist include ORDIL (product name) manufactured by Tokyo Ohka Kogyo Co., Ltd., the MPF series manufactured by DuPont MRC Dry Film Ltd., and SUNFORT (product name) manufactured by ASAHI KASEI MICRODEVICES CORPORATION, and SU-8 (product name) manufactured by Kayaku Micro Chem Co., Ltd.

When a dry film resist is used for formation, first, the dry film resist is laminated for tenting on a rear surface (a second surface) of the silicon substrate having the common liquid chamber formed thereon. Then, the dry film resist is subjected to exposure and development to form a shield so as to block the side surface of the common liquid chamber and so as not to block the pattern opening of the patterning mask. Available exposures include proximity exposure and projection exposure. Alternatively, the shield can also be formed such that a film is formed in advance so as to block the side surface of the common liquid chamber and so as not to block the pattern opening of the patterning mask and then the film is attached to the substrate.

Figure 4:
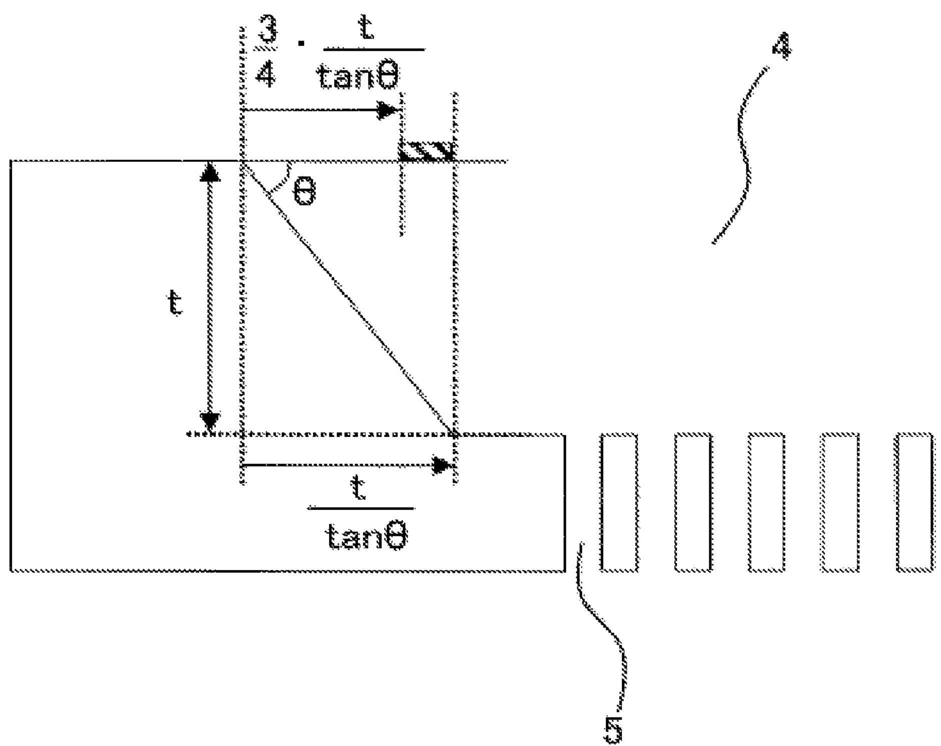
FIG. 4 is a schematic drawing for describing a preferred layout of a shield.

As the extension of the shield to the first depressed portion is reduced and the sheath is formed on an inclined side surface of the common liquid chamber, the ions are affected by the sheath formed on the inclined side surface and the supply port is formed inclined. When supply ports are formed without using the shield on the bottom surface of the common liquid chamber formed using crystal anisotropic etching, the supply port that is the closest to the side surface of the common liquid chamber and located at 0.15 t from the bottom end portion is inclined at 2°, where t is the depth of the first depressed portion, and θ is the angle between the opening surface and the inclined side surface. In contrast to this, when supply ports are formed with the shield covering the entire side surface of the common liquid chamber, a supply port is inclined at 0°, the supply port being the closest to the side surface of the common liquid chamber. From the relation between the range in which the shield blocks the side surface of the common liquid chamber and the inclination of the supply port located in the vicinity of the side surface of the common liquid chamber, in order for a supply port located at 0.15 t or more from the bottom end portion to be formed perpendicularly at 90°±0.5°, at least one end of the shield needs to be in a range from 3/4·t/tan θ to t/tan θ from the opening surface end portion of the common liquid chamber (FIG. 4). Further, the supply port pattern is preferably formed closer to the center of the common liquid chamber. Specifically, in the common liquid chamber (the first depressed portion) having a rectangular opening surface formed by crystal anisotropic etching, a shield satisfying the following equation is preferably formed on the silicon substrate. More specifically, in any cross section at a plane perpendicular to the surface direction of the silicon substrate and parallel to one side of the common liquid chamber (the first depressed portion), the shield is preferably formed in the range of A expressed by the following equation in the surface direction from an end portion of the opening surface of the second surface.

$$3t/4 \tan \theta \leq A \leq t/\tan \theta \quad (1)$$

(A: the distance from the end portion of the opening surface to the end portion of the shield, t: the depth of the first depressed portion, and θ: the angle between the opening surface and the side surface (0°<θ<90°))

Hereinafter, a structure of a liquid ejection head produced using the present embodiment will be described.

Figure 1A:
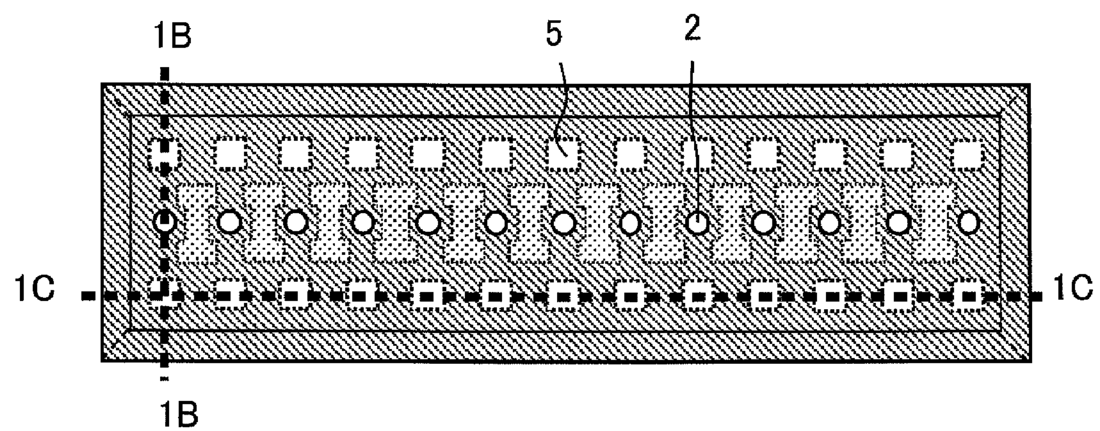
FIGS. 1A, 1B and 1C are schematic views for describing a structure of a liquid ejection head manufactured according to a first embodiment.
Figure 1B:
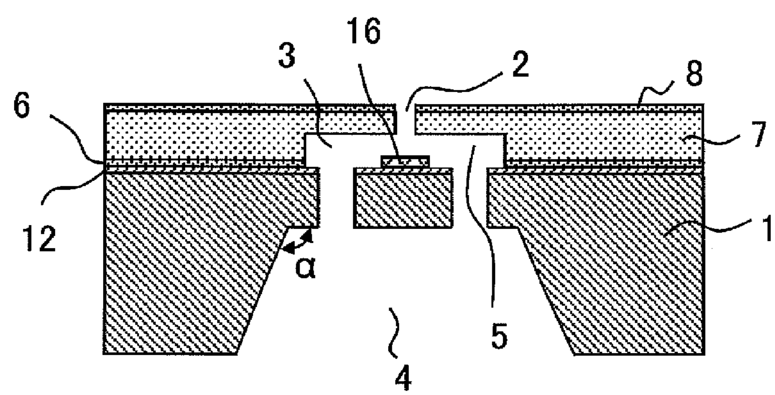
Figure 1C:
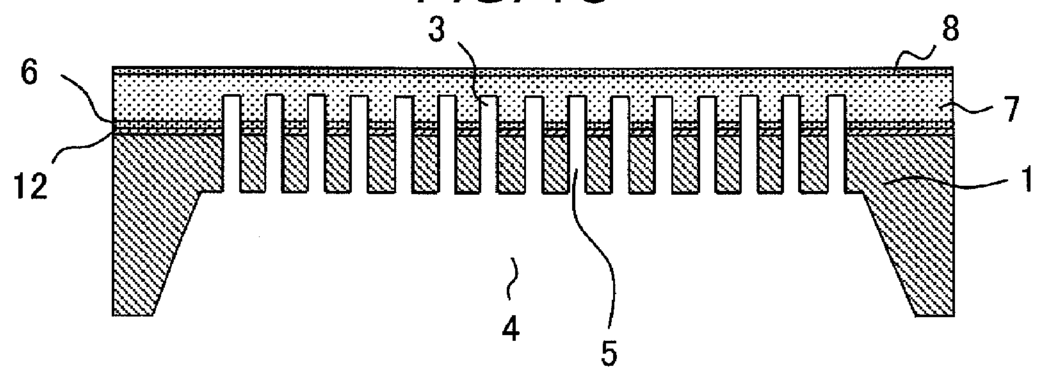

FIGS. 1A to 1C are schematic views illustrating the structure of the liquid ejection head having a head substrate which can be produced using the processing method of a silicon substrate according to the present invention. FIG. 1A is a schematic view viewed from above. FIG. 1B is a schematic sectional view along line 1B-1B of FIG. 1A. FIG. 1C is a schematic sectional view along line 1C-1C of FIG. 1A.

In FIG. 1, the liquid ejection head includes at least a head substrate 1 formed of a silicon substrate; and a flow path forming member 7.

The flow path forming member 7 includes an ejection orifice 2 for ejecting a liquid; and a liquid flow path 3 communicatively connected to the ejection orifice 2. An upper surface of the flow path forming member 7 has a liquid repellent layer 8 formed to improve ejection performance.

The head substrate 1 includes a supply port 5 as a second depressed portion for supplying a liquid to the liquid flow path 3; and a common liquid chamber 4 as the first depressed portion communicatively connected to the supply port 5. A plurality of the supply ports 5 as the second depressed portion are formed on a bottom surface of the common liquid chamber 4 as the first depressed portion. Further, the common liquid chamber 4 as the first depressed portion is formed on a surface opposite to a surface (a first surface) having the flow path forming member 7 (a second surface). The supply ports 5 as the second depressed portion are formed on a bottom surface of the common liquid chamber 4 as the first depressed portion so as to pass through the head substrate 1.

The head substrate 1 and the flow path forming member 7 are bonded to each other through an adhesive 18 so as to communicatively connect the supply ports 5 and the liquid flow path 3. Further, the upper surface (also referred to as the first surface) of the head substrate 1 has a silicon oxide film 12.

The head substrate 1 has an ejection energy generating element 16 such as an electrothermal conversion element for ejecting a liquid, and can include a wiring (unillustrated) for driving the ejection energy generating element. The ejection energy generating element 16 is formed in the head substrate 1 so as to correspond to the position of the ejection orifice 2.

The angle α (see FIGS. 1B and 1C) between the bottom surface and the side surface of the common liquid chamber 4 is an obtuse angle in the range of 90°<α<180°.

The common liquid chamber 4 is not particularly limited, but may be formed, for example, by crystal anisotropic etching. The use of the crystal anisotropic etching allows the common liquid chamber (the first depressed portion) to be formed on the head substrate in a productive and efficient manner. When the common liquid chamber 4 is formed by crystal anisotropic etching, α is about 54.7°. Further, the head substrate can be formed of a silicon substrate with <100> crystal orientation. In this case, the bottom surface of the common liquid chamber 4 is a <100> surface formed by crystal anisotropic etching of the silicon substrate. Furthermore, the thickness of the silicon substrate can be made, for example, 0.3 mm to 1.0 mm. Furthermore, the depth of the common liquid chamber can be, for example, 0.2 mm to 0.9 mm.

Hereinafter, a production method of the liquid ejection head illustrated in FIGS. 1A to 1C will be described using FIGS. 3A to 3K.

Figure 3A:
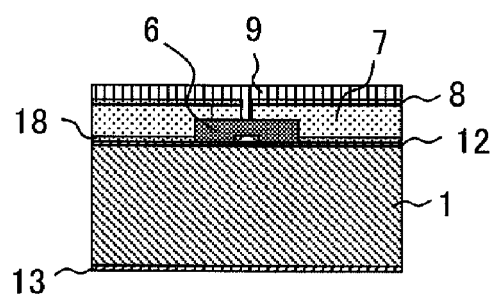
FIGS. 3A, 3B, 3C, 3D, 3E, 3F, 3G, 3H, 3I, 3J and 3K are process views for describing a processing method of the first embodiment.
Figure 3D:
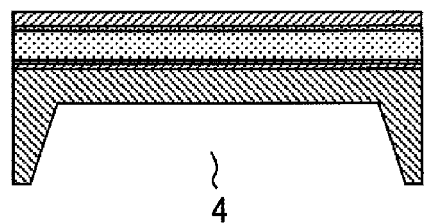
Figure 3B:
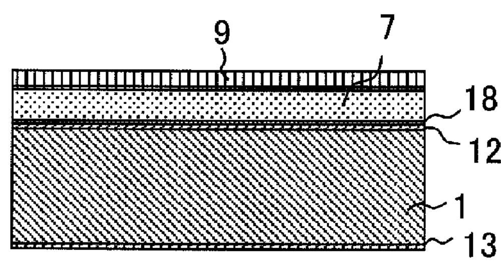

First, as illustrated in FIGS. 3A and 3B, there is prepared a silicon substrate 1 with <100> crystal orientation and not having a common liquid chamber formed yet. The silicon substrate 1 includes an ejection energy generating element 16, a flow path member (or referred to as a flow path structure) 6 of the liquid flow path and a flow path forming member 7 formed so as to cover the flow path member 6 on an upper surface side as the first surface. An upper surface of the flow path forming member 7 has a liquid repellent layer 8 formed thereon, and a further upper surface of the liquid repellent layer 8 is protected by an etching resistant protective film 9. Further, a first etching resistant film 13 is formed on the second surface side of the head substrate 1. The first etching resistant film 13 can be formed for example, using polyether amide.

Note that FIG. 3A corresponds to the sectional view along line 1B-1B of FIG. 1A. FIG. 3B corresponds to the sectional view along line 1C-1C of FIG. 1A. In FIG. 3B, the flow path member 6 is omitted.

Figure 3E:
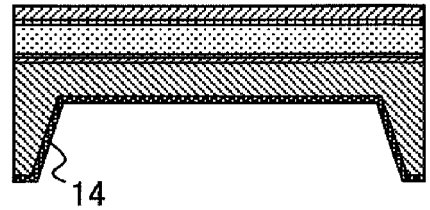
Figure 3C:
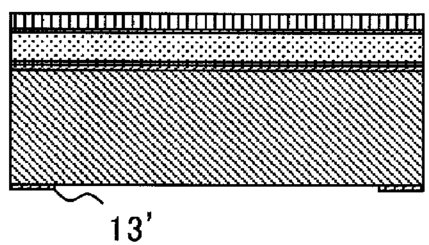

Then, as illustrated in FIG. 3C, the first etching resistant film 13 is patterned to form a first etching mask 13' for forming the common liquid chamber.

Then, as illustrated in FIG. 3D, the first etching mask 13' is used to subject the rear surface (the second surface) of the head substrate 1 to crystal anisotropic etching to form a common liquid chamber 4 as a first depressed portion. Note that the method of forming the common liquid chamber 4 is not particularly limited to the crystal anisotropic etching, but for example, laser processing, dry etching and the like may be used.

Figure 3F:
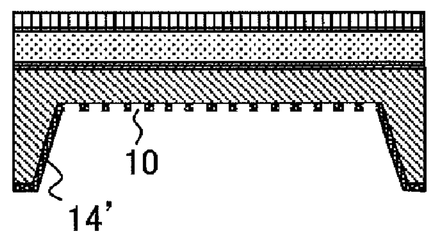

Then, as illustrated in FIG. 3E, a second etching resistant film 14 is formed on the bottom surface of the common liquid chamber 4. Then, as illustrated in FIG. 3F, the second etching resistant film 14 is patterned to form a second etching mask 14' for forming supply ports on the bottom surface of the common liquid chamber 4. The second etching mask 14' has pattern openings 10 corresponding to positions to form respective supply ports.

The second etching mask 14' can be formed, for example, by applying a resist excellent in etching resistance and subjecting the resist to exposure and development. Available resists include novolak resin derivatives and naphthoquinone diazido derivatives. The novolak resin derivatives and the naphthoquinone diazido derivatives are preferably used, because they are excellent in resistance to silicon etchant and etching gas, and can uniformly coat the side surface of the depressed shape, which is the common liquid chamber, with a thin film.

The thickness of the second etching mask 14' is not particularly limited, but an etching mask with a thickness of several μm may be used without a problem as long as the etching mask can function as the etching resistant film.

Specific examples of the resist applying method include a spin coating method, a dip coating method, a spray coating method, and the like for film formation. Of them, the spray coating method is favorable for film formation in consideration of coatability with respect to an inclined depressed portion side surface. The spray coating method allows resist liquid to be atomized and sprayed to uniformly coat the inclined surface. Further, when the resist liquid is sprayed while the silicon substrate is being heated, the solvent is evaporated immediately after the resist liquid adheres to the inclined surface. Consequently, the resist can be uniformly coated on the inclined surface without dripping liquid or remaining liquid.

Available exposures of a pattern to the bottom surface of the common liquid chamber on which the resist is coated include proximity exposure, projection exposure or stepper exposure.

The pattern can be developed by being dipped in a developer using a dipping method, a paddle method, a spray method, and the like.

Figure 3G:
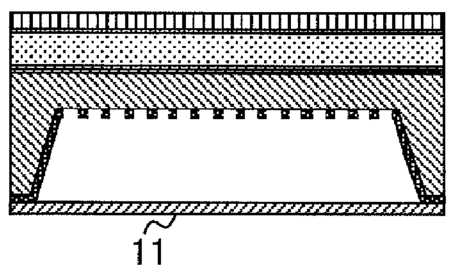

Then, as illustrated in FIG. 3G, a dry film resist is laminated for tenting on the rear surface (the second surface) of the silicon substrate on which the common liquid chamber 4 is formed.

Figure 3H:
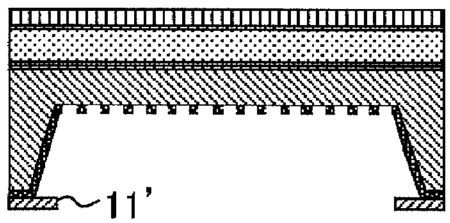
Figure 3I:
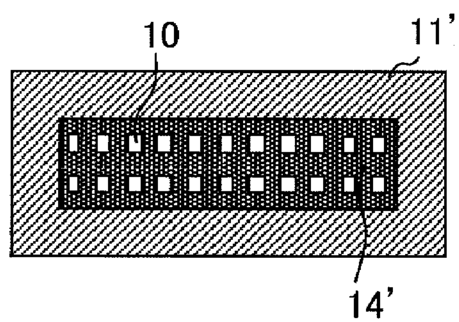

Then, as illustrated in FIG. 3H, the dry film resist is subjected to exposure and development to form a shield 11' so as to block the side surface of the common liquid chamber 4 and so as not to block pattern openings 10 of the second patterning mask. Available exposures include proximity exposure and projection exposure. FIG. 3I is a schematic view viewed from the second surface side (rear surface side) of FIG. 3H. In FIGS. 3H and 3I, the shield 11' is formed on the second surface such that a shadow formed by irradiation of light perpendicular to the silicon substrate toward the common liquid chamber 4 covers the depressed portion side surface but the shadow does not cover the pattern openings 10.

Figure 3J:
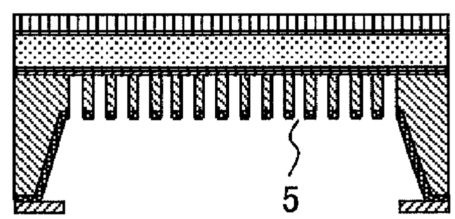

Then, as illustrated in FIG. 3J, the bottom surface of the common liquid chamber 4 on which a resist pattern having the pattern openings 10 is formed is subjected to dry etching to form a plurality of supply ports 5.

Available dry etching includes RIE dry etching using an ECR or an ICP as a plasma source. In order to vertically form a supply port of 100 μm or more, an etcher such as an ICP can be used in the Bosch process of repeating etching by an $SF_6$ gas and deposition by a $C_4F_8$ gas, but an etching system is not limited to this.

The shield 11' and the second patterning mask 14' can be removed as needed. Note that at this time, for the purpose of protecting the liquid flow path wall 7 and the liquid repellent layer 8 on the substrate surface from the etchant, an etchant-resistant resin or the like may be formed as a protection layer on the substrate surface.

Figure 3K:
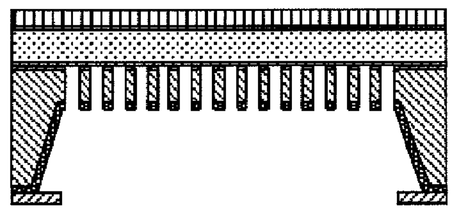

Then, as illustrated in FIG. 3K, a silicon oxide film 12 exposed to the bottom surface of the supply ports 5 is removed. The etching of the silicon oxide film 12 can include wet etching using hydrofluoric acid.

Subsequently, the flow path structure 6 is removed to form the liquid flow path 3. In this process, for example, the flow path structure 6 is exposed to ionizing radiation to cause a decomposition reaction of the flow path structure 6, thereby improving solubility with respect to the remover. The ionizing radiation may be the one used to pattern the flow path structure 6. Note that the purpose of this process is to remove the flow path structure 6 to form the liquid flow path 3, and thus the entire flow path structure 6 can be exposed ionizing radiation without a mask. Subsequently, the same developer as the developer used to pattern the flow path structure 6 can be used to completely remove the flow path structure 6.

The aforementioned process completes the production of the liquid ejection head.

Further, the application of the processing method of a silicon substrate of the present embodiment to the production of the liquid ejection head enables the production of the liquid ejection head having a high liquid refilling performance. Furthermore, since the supply ports as the second depressed portion can be formed at a high positional accuracy, the position tolerance of the supply port can be reduced, and hence the size of the head substrate can be reduced. As a result, costs can be reduced.

Second Embodiment

In a second embodiment, the first depressed portion such as a common liquid chamber is formed into a shape to prevent the sheath from being formed along the side surface. Accordingly, dry etching can be performed so as to prevent the sheath from being formed along the side surface.

Figure 6A:
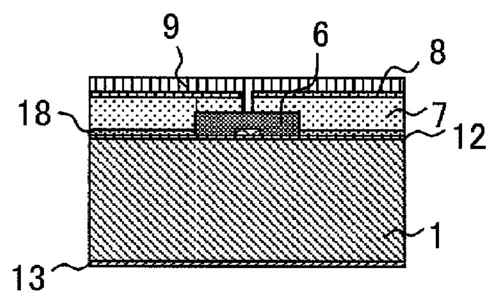
FIGS. 6A, 6B, 6C, 6D, 6E, 6F, 6G, 6H and 6I are process views for describing a processing method of the second embodiment.
Figure 6D:
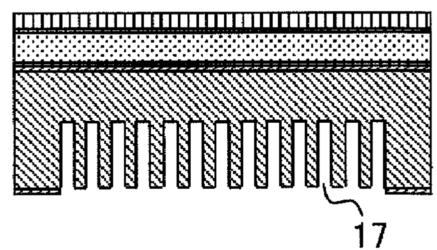
Figure 6B:
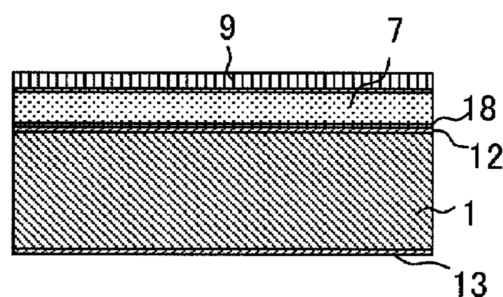
Figure 6E:
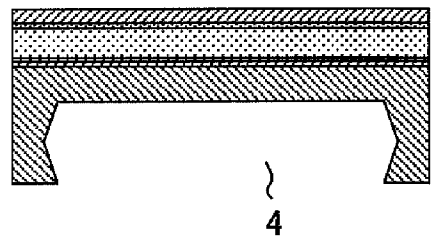

More specifically, in the present embodiment, dry etching is performed on the first depressed portion such as the common liquid chamber 4 having the shape as illustrated in FIG. 6E. The shape of the first depressed portion according to the present embodiment has a first cross section whose opening area is larger than the opening surface of the first depressed portion and largest among cross sections of the first depressed portion, in the direction parallel to the surface direction of the silicon substrate. Further, the first cross section is located between the opening surface and the bottom surface. The angle between the bottom surface and the first side surface from the bottom surface to the first cross section is an obtuse angle. In the present embodiment, the portion of the silicon substrate forming the second side surface from the first cross section to the opening surface serves as the shield structure.

According to the method of the present embodiment, the first depressed portion itself formed on the silicon substrate is processed into a shape blocking the side wall. Thus, a shield need not be formed additionally.

Further, the first depressed portion according to the present embodiment has such a shape that the shadow formed by irradiation of light perpendicular to the second surface toward the first depressed portion covers at least part of the first side surface but the shadow is not formed on the pattern opening of the resist pattern.

Furthermore, the first depressed portion can be formed such that the shadow covers the entire first side surface, but the present embodiment is not particularly limited to this.

The bottom surface of the first depressed portion is subjected to dry etching to form a second depressed portion. In this process, when the first depressed portion is formed into an eaves shape as illustrated in FIG. 6E, the sheath is hardly affected by the inclination of the side surface by the same reason as the shield of the first embodiment. Thus, the sheath is formed in almost the same way as in the case where the opening of the vertical depressed portion is at the position of the eaves. Accordingly, the sheath deformation is abated and ions are not accelerated in a direction of the side surface of the depressed portion. Thus, when the supply ports are etched, a part of the deposited film of the side wall is less etched. Therefore, the etching proceeds without a lateral shift, and the substrate can be etched perpendicularly.

Note that as the unshielded area of the first side surface increases in the eaves portion, the ions are affected by the sheath formed on the first side surface. When etching proceeds under such circumstances, the second depressed portion such as the supply ports are formed inclined. When the supply ports are formed without forming the shield, the supply port that is the closest to the side surface of the common liquid chamber and located at 0.15 t from the bottom end portion is inclined at 2° where t is the depth of the first depressed portion, and θ is the angle between the opening surface and the first side surface. In contrast to this, when the supply ports are formed with the eaves portion covering the entire first side surface, the supply port that is the closest to the side surface of the common liquid chamber is inclined at 0°. From the relation between the range in which the eaves portion blocks the side surface of the common liquid chamber and the inclination of the supply port located in the vicinity of the side surface of the common liquid chamber, in order for a supply port located at 0.15 t or more from the bottom end portion to be formed perpendicularly at 90°±0.5°, an opening surface end portion needs to be in a range of t/4 tan θ from the bottom end portion of the common liquid chamber. More specifically, the opening surface of the first depressed portion has a rectangular shape, and in any cross section at a plane perpendicular to the surface direction and parallel to one side of the opening surface, the second depressed portion can be formed vertically (at 90°±0.5°) on the bottom surface of the first depressed portion in the following range. That is, an end portion of the shadow formed on the first side surface can be in the range of t/4 tan θ (t: the depth of the first depressed portion, and θ: the angle between the opening surface and the first side surface) in the surface direction from the end portion of the bottom surface. Further, the supply port pattern is preferably formed closer to the center of the first depressed portion.

For example, a guide hole is formed on the second surface side of the silicon substrate, and then the first depressed portion of the present embodiment can be formed by crystal anisotropic etching. The guide hole can be formed by laser. Alternatively, the guide hole can be formed by dry-etching the second surface of the silicon substrate.

In order to block the aforementioned range, a guide hole is formed on the second surface side of the silicon substrate by dry etching or laser processing, and a common liquid chamber may be formed by adjusting the anisotropic etching time. The longer the etching time, the larger the unshielded area. Thus, in order to block the aforementioned range, the etching is performed by controlling the width and depth of the guide hole and the crystal anisotropic etching time to form the common liquid chamber. In order to increase the shielded area, it is preferable to form the guide hole so as to be close to an inner periphery of the etching mask.

Hereinafter, a structure of a liquid ejection head manufactured using the present embodiment will be described.

Figure 5A:
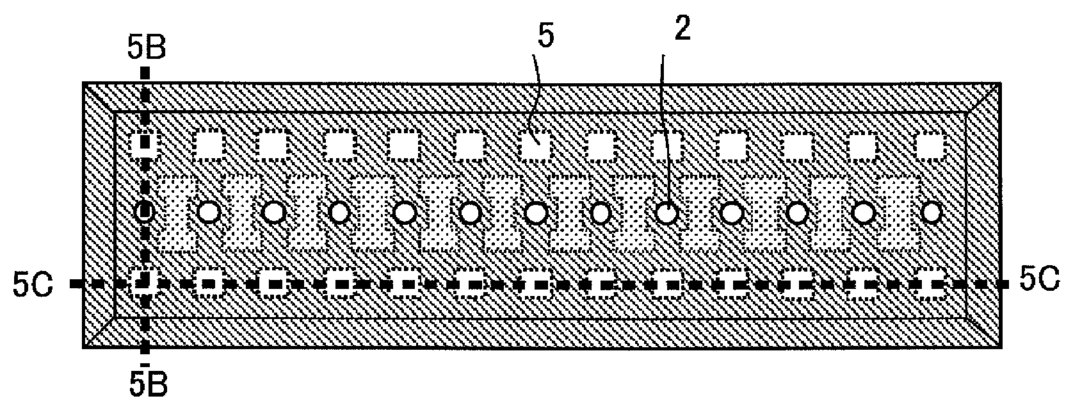
FIGS. 5A, 5B and 5C are schematic views for describing a structure of a liquid ejection head manufactured according to a second embodiment.
Figure 5B:
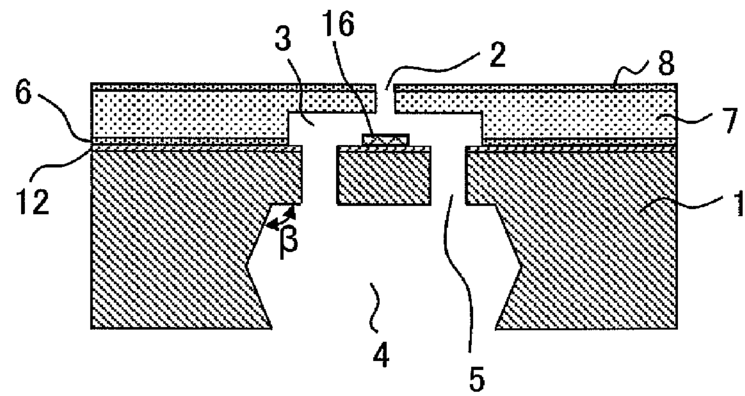
Figure 5C:
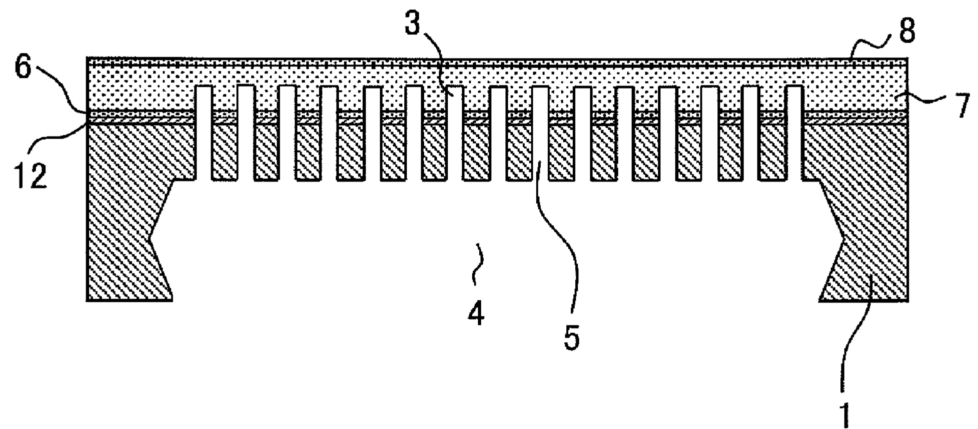

FIG. 5A is a schematic view of an upper surface of a liquid ejection head produced according to the present embodiment. FIG. 5B is a schematic sectional view along a dotted line 5B-5B of FIG. 5A. FIG. 5C is a schematic sectional view along a dotted line 5C-5C of FIG. 5A.

In FIGS. 5A to 5C, the liquid ejection head includes at least a head substrate 1 formed of a silicon substrate; and a flow path forming member 7.

The flow path forming member 7 includes an ejection orifice 2 for ejecting a liquid; and a liquid flow path 3 communicatively connected to the ejection orifice 2. An upper surface of the flow path forming member 7 has a liquid repellent layer 8 formed to improve ejection performance.

The head substrate 1 includes a supply port 5 as a second depressed portion for supplying a liquid to the liquid flow path 3; and a common liquid chamber 4 as a first depressed portion communicatively connected to the supply port 5. The supply port 5 as the second depressed portion includes a plurality of supply ports 5 formed on a bottom surface of the common liquid chamber 4 as the first depressed portion. Further, the common liquid chamber 4 as the first depressed portion is formed on a surface (a second surface) opposite to a surface having the flow path forming member 7 (a first surface). The supply ports 5 as the second depressed portion are formed on a bottom surface of the common liquid chamber 4 as the first depressed portion so as to pass through the head substrate 1.

The shape of the common liquid chamber 4 has a first cross section whose opening area is larger than the opening surface and largest among cross sections of the common liquid chamber portion of the silicon substrate in the direction parallel to the surface direction. Further, the first cross section is located between the opening surface and the bottom surface. The angle between the bottom surface and the first side surface from the bottom surface to the first cross section is an obtuse angle. When the common liquid chamber is formed into such an eaves shape, the common liquid chamber hardly affected by the inclination of the side surface. Thus, the sheath is formed in almost the same way as in the case where the opening of the vertical depressed portion is at the position of the eaves.

The head substrate 1 and the flow path forming member 7 are bonded to each other through an adhesive 6 so as to communicatively connect the supply ports 5 and the liquid flow path 3. Further, the upper surface (also referred to as the first surface) of the head substrate 1 has a silicon oxide film 12.

The head substrate 1 has an ejection energy generating element 16 such as an electrothermal conversion element for ejecting a liquid, and can include a wiring (unillustrated) for driving the ejection energy generating element. The ejection energy generating element 16 is formed in the head substrate 1 so as to correspond to the position of the ejection orifice 2.

The angle β (see FIGS. 5B and 5C) between the bottom surface of the common liquid chamber 4 and the first side surface is an obtuse angle in the range of 90°<α<180° C.

Third Embodiment

In a first embodiment, only a minimum region containing the portion to form supply ports is opened in the shield and the other regions are entirely shielded. The third embodiment has a similar effect by using a part of the silicon substrate.

More specifically, the present embodiment is based on the concept that the head substrate is bonded to another silicon substrate having a common liquid chamber such that the opening portion is positioned inside so as to use the silicon substrate itself as a shield for suppressing the sheath deformation.

Figure 11A:
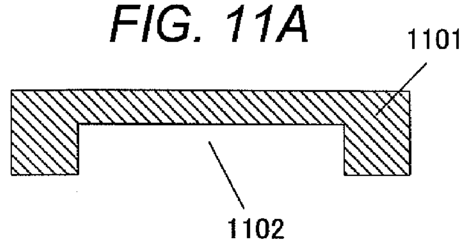
FIGS. 11A, 11B, 11C, 11D, 11E and 11F are process views for describing a processing method of a third embodiment.

First, as illustrated in FIG. 11A, a first depressed portion 1102 (a common liquid chamber) is formed in advance on a second surface side of a first silicon substrate 1101 having a first surface and a second surface opposite to the first surface so as not to pass through the first silicon substrate 1101. The first depressed portion may have a silicon oxide film formed by thermal oxidation. The silicon oxide film can improve ink resistance.

Figure 11B:
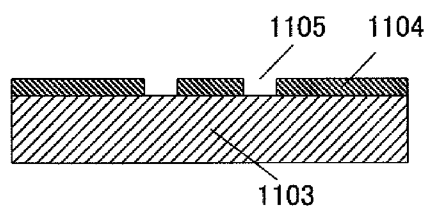

Then, as illustrated in FIG. 11B, an intermediate layer 1104 is formed on a second silicon substrate 1103, and a pattern opening (first pattern opening) 1105 of the supply ports is formed in the intermediate layer 1104.

Figure 11C:
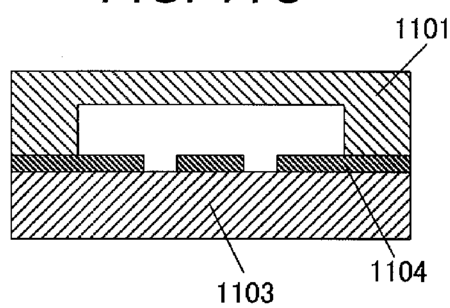

Then, as illustrated in FIG. 11C, the second silicon substrate 1103 is bonded to a surface (a second surface) on which side the first depressed portion 1102 of the first silicon substrate 1101 is opened, via the intermediate layer 1104.

Then, a second patterning mask is formed on a surface (the first surface) of the first silicon substrate opposite to the intermediate layer 1104. The second pattern opening of the second patterning mask is formed by an opening pattern containing a position perpendicular to the surface direction of the first pattern opening.

Figure 11D:
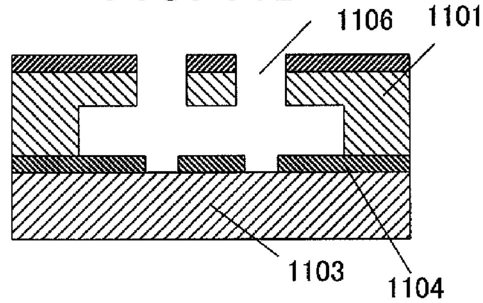

Then, as illustrated in FIG. 11D, a through-hole 1106 is formed by silicon etching using a second patterning mask from the side of the first silicon substrate 1101. The through-hole 1106 is formed in a region of the intermediate layer corresponding to the first pattern opening.

Figure 11E:
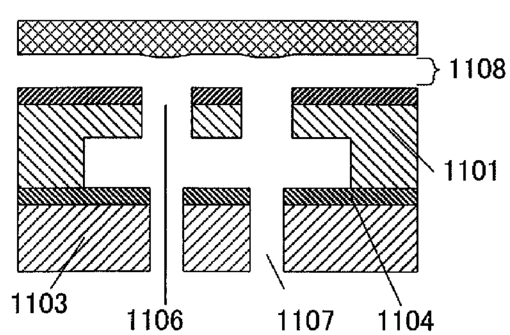

Then, as illustrated in FIG. 11E, the intermediate layer 1104 having the first pattern shape 1105 is used as a mask to form a supply port 1107 in the second silicon substrate 1103 by reactive ion etching. At this time, the first surface of the first silicon substrate functions as the shield structure, which can reduce the plasma molding effect.

The aforementioned process allows the common liquid chamber 1102 to be sealed by the silicon substrate. Thus, the common liquid chamber 1102 is hardly exposed to the plasma during supply port etching. Consequently, the deformation of the sheath 1108 is greatly suppressed and vertical supply port etching can be performed.

The materials of the intermediate layer are not particularly limited, but include a resin material, silicon oxide (SiO), silicon nitride (SiN), silicon oxynitride (SiON), silicon carbide (SiC), and the like. Specific examples of the resin layer include a photosensitive resin layer. Of them, the photosensitive resin layer and the silicon oxide film can be used as the intermediate layer because of ease of formation.

Specific examples of the bonding method include adhesive bonding using resin materials and the like, fusion bonding by spontaneous bonding of activated surfaces brought into contact with each other, eutectic bonding, diffusion bonding, and the like.

Figure 11F:
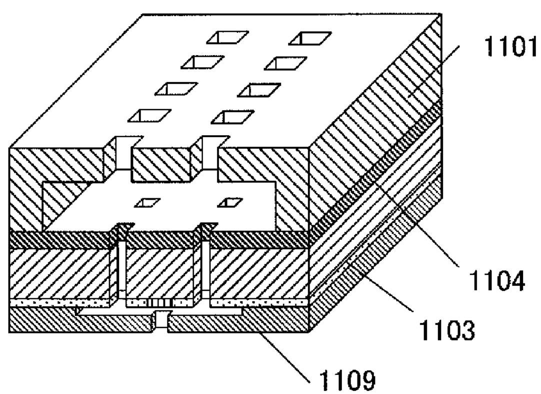

A substrate itself having a liquid ejection energy generating element can be used as the second silicon substrate. The thickness of the substrate is, for example, 50 to 800 μm. From the point of view of the supply port shape, the thickness of the substrate can be 100 to 200 μm. In order to obtain a desired thickness, the substrate may be made thinner before bonding. Specific examples of the thinning method include mechanical polishing such as back grinding, CMP, wet etching or dry etching, and a combination thereof. As needed, the surface can be polished to a mirror finish by fine mechanical polishing, chemical polishing, or a combination thereof. A flow path forming layer 1109 having the ejection orifice 2 and the liquid repellent layer 8 formed using the flow path structure 6 and the liquid flow path wall 7 can be formed before supply port etching, namely, between the processes in FIGS. 11C and 11D. FIG. 11F is a perspective view after the process of forming the flow path forming layer completes.

Figure 12A:
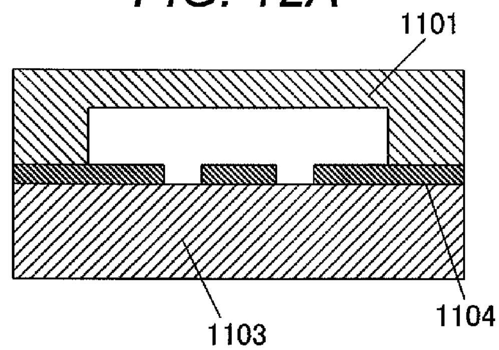
FIGS. 12A, 12B and 12C are process views for describing a processing method of the third embodiment.
Figure 12B:
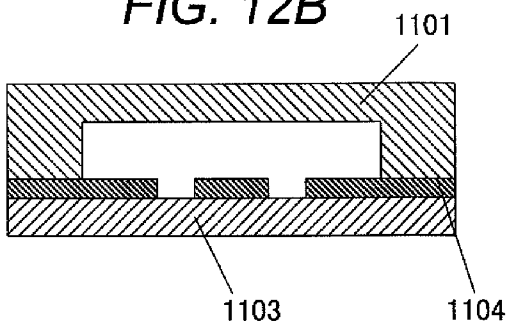
Figure 12C:
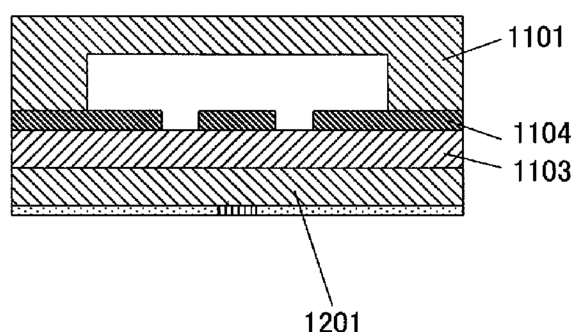

Alternatively, as illustrated in FIGS. 12A to 12C, there is another method by which a substrate not having a liquid ejection energy generating element as the second silicon substrate is bonded to a substrate having a further thinned liquid ejection energy generating element. It may be difficult to form an intermediate layer on a substrate subjected to thinning because of limitation of the conveyance system of the process apparatus. In contrast to this, for example, another method can be considered in which the first silicon substrate 1101 is bonded to the second silicon substrate 1103 (FIG. 12A), the second silicon substrate is subjected to thinning (FIG. 12B), and then another substrate 1201 having a liquid ejection energy generating element also subjected to thinning is bonded thereto (FIG. 12C). The substrates are formed such that the total thickness of the second silicon substrate 1103 and the substrate having a liquid ejection energy generating element is 50 to 800 μm, and is desirably 100 to 200 μm. The second silicon substrate may be bonded to the head substrate directly or by means of an intermediate layer. The flow path forming layer can also be formed before the supply ports are etched.

The first silicon substrate may be prepared such that the first depressed portion 1102 (the common liquid chamber) is formed and then a silicon oxide film is formed thereinside. This can remove any concern that the inside of the common liquid chamber is exposed to etching when the supply ports are etched. The coating of the silicon surface by an oxide film also has an advantage of improving ink resistance. Specific examples of the method of forming a silicon oxide film include thermal oxidation, CVD, and the like.

Hereinafter, the bonding methods and the intermediate layer will be described further in detail.

When a resin material is selected as the intermediate layer, silicon substrates can be bonded, for example, by the following method. First, a resin is applied to a silicon substrate and is patterned to form an intermediate layer. Then, under silicon substrate is stacked on the intermediate layer so as to be sandwiched therebetween. Then, in a state in which the temperature rises to a temperature equal to or greater than the glass transition temperature, a pressure can be applied for adhesion. Almost all common resin materials can be used for adhesion. Specific examples of the resin material include, acrylic-based resins, polyimide-based resins, silicone-based resins, fluorine-based resins, epoxy-based resins, polyetheramide-based resin, and the like.

Specific examples of the acrylic-based resin include PMMA (polymethylmethacrylate) resins. Specific examples of the silicone-based resin includes PDMS (polydimethylsiloxane) resins. Specific examples of the epoxy-based resin includes SU-8 (product name) manufactured by Kayaku Micro Chem Co., Ltd. Specific examples of the polyetheramide-based resin includes HIMAL (product name), BCB (Benzocyclobutene), HSQ (HydrogensSlises-Quioxane) and the like manufactured by Hitachi Chemical Co., Ltd.

The method of forming the first pattern shape will be described. Photosensitive resin materials can be patterned by lithography. Non-photosensitive resin materials can be patterned by etching. Non-silicon-containing resin layers can be etched by a plasma process using gases such as $O_2$, $O_2/CF_4$, $O_2/Ar$, $N_2$, $H_2$, $N_2/H_2$, and $NH_3$. Silicon-containing resin layers can be etched by adding a fluorocarbon-based gas such as $CF_4$ and $CHF_3$ to these gases.

Other bonding methods include a fusion bonding method by which a bonding surface is plasma-activated to form a dangling bond. The fusion bonding is roughly divided into two methods.

The first method is such that the surface of the intermediate layer is plasma-activated and then exposed to the atmosphere to form OH groups, thereby being bonded to the surface of the silicon substrate via hydrogen-bonding. The OH groups are formed by a reaction with water existing in the atmosphere. Alternatively, instead of merely utilizing the existing water in the air, moisture can be intentionally added to the OH groups. Specific examples of the material of the intermediate layer applicable to this method include a silicon oxide film, a silicon nitride film, a silicon carbide film, and the like. Further, the other examples of the material includes metal materials, metal oxides, a part of resin materials easy to form an oxide film on the surface. A temporary bonding is performed at room temperature and then annealing is performed at about 200 to 300° C. Thereby, a dehydration reaction between the OH groups causes $H_2O$ to be desorbed, and thus a strong bonding through oxygen atoms can be obtained. Note that the surfaces need to be close to each other within the range in which intermolecular force reaches, and hence the surface roughness is preferably 1 nm or less.

The second method involves directly bonding the dangling bonds to each other without hydrogen bonding in vacuum. This method is said to require a material with a surface roughness of 1 nm or less. If this condition can be satisfied by polishing or the like, it is theoretically possible to use any material for bonding. Silicon-based materials have been confirmed such that at least silicon oxide films, silicon nitride films, or these films and silicon can be bonded to each other. The silicon oxide film and the silicon nitride film can be patterned by plasma using a fluorocarbon-based gas such as $CF_4$, $CHF_3$, $C_2F_6$, $C_3F_8$, $C_4F_8$, $C_5F_8$, and $C_4F_6$. Further, the silicon oxide film can also be patterned, for example, by hydrofluoric-acid-based wet etching. Furthermore, the silicon nitride film can also be patterned, for example, by thermal phosphoric-acid-based wet etching. Note that the present invention can be applied to any metal material and metal oxide for use in the intermediate layer which can be patterned before bonding.

Other bonding methods include eutectic bonding and diffusion bonding. The eutectic bonding method has been known to bond a combination of gold and gold, a combination of gold and silicon, a combination of gold and tin, a combination of gold and germanium, a combination of copper and tin, a combination of palladium and indium, and other combinations. The diffusion bonding method has been known to bond a combination of gold and gold, a combination of copper and copper, a combination of aluminum and aluminum, and other combinations.

Next, the relation among the intermediate layer, the silicon substrate, and the dry etching will be described.

For example, when the Bosch process is used, a commonly used resist mask can easily have an etching rate ratio of 50 or more. For example, when a resin material is used as the intermediate layer, the composition of the material is close to that of the resist mask, and hence almost all resin materials have the similar results. The film thickness of the resin material as the intermediate layer is, for example, about several hundred nm to several tens of μm. This film thickness is sufficient as a mask or stopper for use in etching silicon, for example, to a depth of 50 to 800 μm.

The silicon oxide film has been known to have an etching rate ratio of at least 100 or more to silicon. When the thermal oxidation method is applied to the silicon oxide film, it has been known that the film could have a thickness of 25 μm or larger. In consideration of the film quality and the process difficulty, the film thickness is desirable to be equal to or less than 2 μm. When the plasma CVD process is used, it has been known that the film could have a thickness of 50 μm or larger. In consideration of the film quality and the process difficulty, the film thickness is desirable to be equal to or less than 10 μm. These film thicknesses are sufficient for a mask for use in etching a silicon oxide film, for example, to a depth of 50 to 800 μm.

Some metal and metal oxide other than silicon may have a further higher selection ratio to silicon. Low reactive materials with respect to F-radicals are particularly favorable. For example, chrome and aluminum may have an etching rate ratio of more than 1000. In general, the film thickness of metal or metal oxide is about several μm. In order to obtain a desired etching depth, the etching rate ratio between the material and silicon needs to be considered to select the film thickness as needed.

The use of the method of the present embodiment allows an inlet port for introducing a liquid from a rear surface of the substrate to be arranged in a position not two dimensionally overlapped with the supply port. As an intermediate body for connecting the substrate having a liquid ejection energy generating element and a liquid supply tank (unillustrated), for example, a processed aluminum plate is used. The aluminum plate processing accuracy is far inferior to the semiconductor process using photolithography. Consequently, a reduction in the common liquid chamber size or chip size may cause a difficulty in processing aluminum corresponding to the position.

Figure 13A:
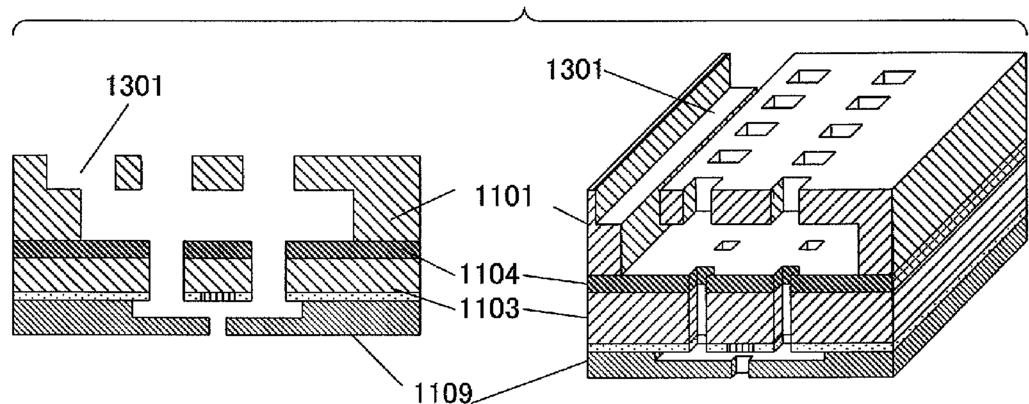
FIGS. 13A and 13B are process views for describing a processing method of the third embodiment.
Figure 13B:
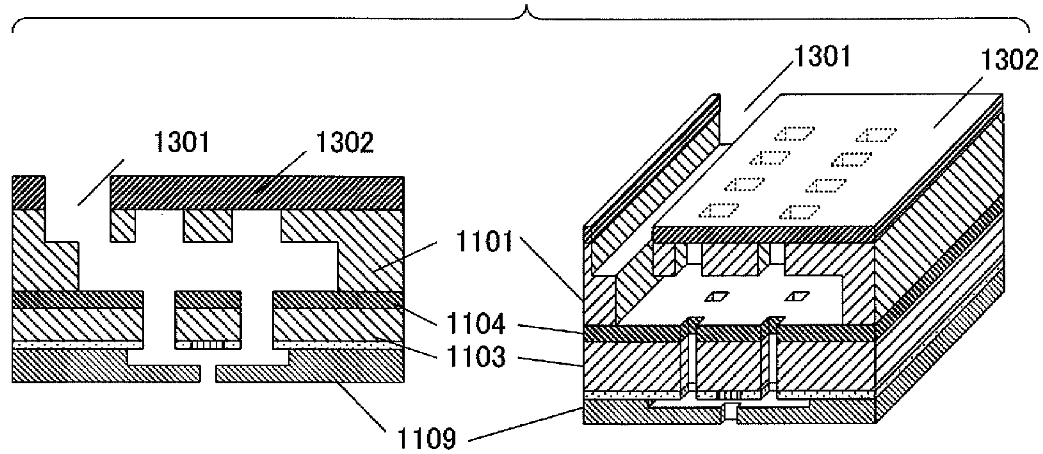

According to the present embodiment, the common liquid chamber is formed inside the substrate in advance. Consequently, an opening 1301 can be disposed later in any position connectable to the common liquid chamber (FIG. 13A). Thus, a connection port for connecting the common liquid chamber and the liquid supply tank can be disposed again in any position. Note that the opening 1301 formed on the first silicon substrate for etching the supply port can be covered and sealed, for example, by means of an aluminum plate 1302 (FIG. 13B).

According to the present embodiment, FIG. 11D illustrates a stacked structure including: a second silicon substrate; an intermediate layer as the patterning mask formed on the second silicon substrate; and a first silicon substrate formed on the intermediate layer and having a first opening allowing the pattern opening to be exposed and a through-hole communicatively connected to a surface opposite to the first opening and the intermediate layer. The through-hole is formed by an opening pattern including a position perpendicular to the surface direction of the pattern opening. In the present embodiment, reactive ion etching is performed from the through-hole side to form the second opening on the second silicon substrate. Thus, it is understood that the first surface of the first silicon substrate functions as a shield structure.

Fourth Embodiment

Like the third embodiment, a fourth embodiment suppresses the plasma molding effect using a part of the silicon substrate based on a different concept.

The fourth embodiment is based on the concept that the head substrate is bonded to another silicon substrate for forming a common liquid chamber, a dummy pattern is placed in the pattern to form the common liquid chamber, and thereby the actual opening width is reduced to suppress the sheath deformation.

Figure 15A:
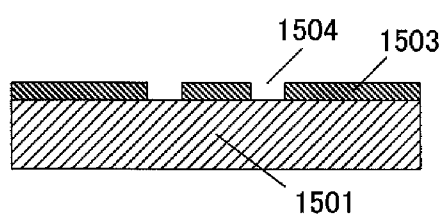
FIGS. 15A, 15B, 15C, 15D and 15E are process views for describing a processing method of a fourth embodiment.

First, as illustrated in FIG. 15A, a first pattern opening 1504 having a supply port pattern is formed in an intermediate layer 1503 formed on a surface of a first silicon substrate 1501.

Figure 15B:
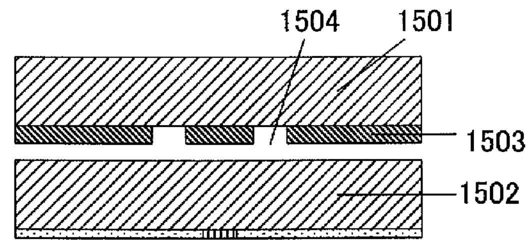

Then, as illustrated in FIG. 15B, a second silicon substrate 1502 is bonded to the first silicon substrate 1501 with the intermediate layer 1503 sandwiched therebetween.

Figure 15C:
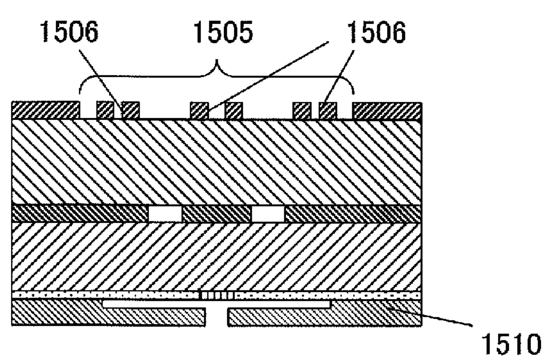

Then, as illustrated in FIG. 15C, a second patterning mask having a second pattern opening 1505 for forming a common liquid chamber is formed on the side of the first silicon substrate 1501. The second patterning mask pattern contains a third pattern 1506 for forming a dummy structure for suppressing the plasma molding effect.

Figure 15D:
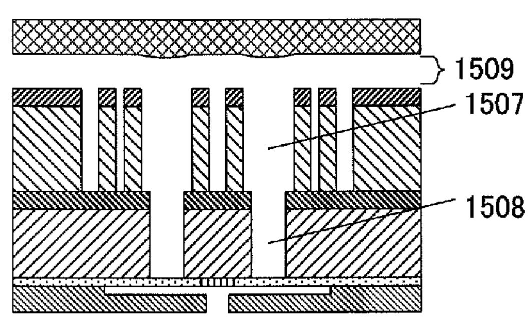

Then, as illustrated in FIG. 15D, the second patterning mask is used to form a common liquid chamber 1507 by means of silicon etching. As the silicon etching, reactive ion etching can be used.

Then, the intermediate layer 1503 having the first pattern opening 1504 is used as the mask to form a supply port 1508 by means of reactive ion etching.

Figure 15E:
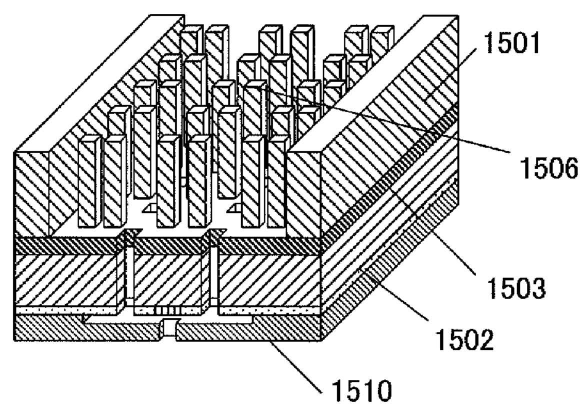

The dummy structure formed of the dummy pattern 1506 may have any layout and shape as long as the layout and shape do not prevent ink supply. For example, a dot-shaped array structure as illustrated in FIG. 15E is appropriate.

More specifically, the second patterning mask formed on the first surface of the first silicon substrate includes a side wall pattern for forming an outer wall (side wall) of the common liquid chamber; and a dummy pattern for forming the dummy structure. The dummy pattern is formed in a region other than a position perpendicular to the surface direction of the pattern opening located inside the side wall pattern and formed in the intermediate layer.

The dummy structure is disposed inside the common liquid chamber and in a region other than the first pattern opening 1504 of the intermediate layer 1503. For example, the dummy structure may include a plurality of dummy structures columnarly formed in the common liquid chamber. The dummy structures formed in the common liquid chamber can function as the shield structure to reduce the plasma molding effect.

The bonding process, the intermediate layer materials, the etching method, and the like are based on those in the third embodiment.

The aforementioned process allows the common liquid chamber 1507 to be etched with an opening width substantially narrower than the original opening width. Thus, the deformation of the sheath 1509 is greatly suppressed and vertical supply port etching can be performed.

Example 1

As an example 1 according to the first embodiment, a liquid ejection head was produced by means of a liquid ejection head production method illustrated in FIGS. 3A to 3K.

There was prepared a head substrate 1 having the (100) surface and including a liquid ejection energy generating element 16, a flow path structure 6, an ejection orifice 2 formed using a liquid flow path wall 7, and a liquid repellent layer 8.

First, the OBC (product name) manufactured by Tokyo Ohka Kogyo Co., Ltd. was applied as a protection layer 9 to the entire liquid repellent layer 8 (FIGS. 3A and 3B). Then, a polyether amide resin HIMAL (product name) manufactured by Hitachi Chemical Co., Ltd., was applied to form an etching resistant film 13 on a rear surface of the head substrate 1.

Then, a photosensitive positive resist OFPR-800 (product name) manufactured by Tokyo Ohka Kogyo Co., Ltd., was applied to the entire etching resistant film 13. A slit-shaped supply port pattern was formed on the applied positive resist by means of a Deep-UV exposure apparatus UX-3000 (product name) manufactured by Ushio Inc. Then, a combined gas of $CF_4$ and $O_2$ was used to perform chemical dry etching on the positive resist to form the etching resistant film 13 into a slit-shaped supply port pattern to form a first etching mask 13' (FIG. 3C).

Then, the first etching mask 13' having the supply port pattern was used as a mask to dip the silicon substrate in a tetramethylammonium hydroxide aqueous solution at 80° C. to be subjected to anisotropic etching to form a common liquid chamber 4 (FIG. 3D). Note that the anisotropic etching is performed by calculating the etching rate so that the depth of the common liquid chamber 4 to be formed was 475 μm when the silicon substrate was dipped in the aqueous solution. Note also that the etching mask may be prepared on the substrate in advance.

Then, the first etching mask 13' was removed.

Then, a photosensitive positive resist layer 14 was formed on the surface subjected the anisotropic etching by means of a spray coater (manufactured by EV Group) (FIG. 3E). As the photosensitive positive resist, AZ-P4620 (product name) manufactured by AZ Electronic Materials was used. The resist was uniformly applied on inclined and edge portions by heating the substrate chuck so that the substrate is maintained at 60° C. during spray coating.

The photosensitive positive resist 14 was exposed with an exposure dose of 1000 mJ/cm$^2$ through the supply port pattern mask by means of a projection exposure apparatus UX-4023 (product name) manufactured by Ushio Inc. Here, the position to be exposed is the bottom portion of the supply ports formed by anisotropic etching. Accordingly, the exposure focus position was set to be lower by the anisotropic etching depth. Then, a 2.38% tetramethylammonium hydroxide aqueous solution was used to develop and form a second etching mask 14' having a pattern opening 10 including fine supply ports on the bottom surface of the common liquid chamber (FIG. 3F).

Then, a photosensitive negative dry film resist 11 AR-340 (product name) manufactured by Tokyo Ohka Kogyo Co., Ltd., was laminated on the rear surface of the substrate (FIG. 3G). Then, the obtained shield 11' was patterned into an eaves shape extending 336 μm from the opening surface end portion of the common liquid chamber by means of the projection exposure apparatus UX-4023 (product name) manufactured by Ushio Inc. The eaves-shaped shield extending 336 μm from the opening surface end portion can block the range from the opening surface end portion of the common liquid chamber up to a borderline between the bottom surface and the side surface of the common liquid chamber 4 when the depth of the common liquid chamber 4 is 475 μm.

Then, a 1% aqueous sodium carbonate solution was used to develop and form a shield 11' blocking the inclined surface of the common liquid chamber into an eaves shape (FIG. 3H). FIG. 3I is a schematic plan view of the substrate after the shield 11' was formed.

Then, AMS200 (product name) manufactured by Alcatel-Lucent Corporate was applied from above the second etching mask 14'. More specifically, the Bosch process was used to etch the substrate 1 until the silicon oxide film 12 that is an etching stop layer of the upper surface to form supply ports 5 (FIG. 3J). The angles of the supply ports from a supply port closest to the inclined surface of the common liquid chamber up to a sixth supply port were in a range of 89.7° to 90.3°, and the average angle was 90.0°. Then, the silicon oxide film 12 as the etching stop layer was wet-etched and removed by means of a buffered hydrofluoric acid 110U (product name) manufactured by Daikin Industries, Ltd. (FIG. 3K).

Then, the second etching mask 14' and the shield 11' were removed by oxygen plasma asking, and the OBC (product name) as the protection layer 9 was removed with xylene. Then, the entire liquid repellent layer 8 was exposed from above with an exposure dose of 7000 mJ/cm$^2$ by means of a Deep-UV exposure apparatus UX-3000 (product name) manufactured by Ushio Inc., to solubilize the flow path structure 6 to form a liquid flow path pattern. Then, the flow path structure 6 was dipped into methyl lactate and ultrasonic waves were applied to remove the flow path structure 6. Thus, a liquid ejection head was produced as illustrated in FIGS. 3A and 3B.

Example 2

In Example 1, only the inclined side surface of the common liquid chamber was blocked, but in the present example, an eaves-shaped shield was formed which blocks not only the inclined side surface of the common liquid chamber but also up to the bottom surface thereof. The eaves-shaped shield was formed in the same manner as in Example 1. More specifically, the eaves-shaped shield had a shape extending 600 μm from the opening surface end portion of the common liquid chamber so as not to block the pattern opening of the resist pattern located on the bottom surface of the common liquid chamber. Then, like Example 1, the Bosch process was used for etching to form supply ports 5.

The angle of the third supply port from the inclined side surface was in a range of 89.5° to 89.6°, and the average angle was 89.5°. As a result, unless the shielding film blocks the pattern opening of the resist pattern, the shield range can be expanded until the bottom surface of the common liquid chamber is blocked and the supply ports can be formed with angles in the range of 90°±0.5°.

Example 3

In Example 3, the production method illustrated in FIGS. 3A to 3K was applied to produce a liquid ejection head. The processes from the step of preparing the substrate 1 to that of forming the second etching mask 14' having the pattern opening 10 are the same as the processes in Example 1 (FIG. 3F).

The shield was formed as follows.

First, a photosensitive negative dry film resist 11 (AR-340) manufactured by Tokyo Ohka Kogyo Co., Ltd., was placed on a film. Then, the filmy resist was exposed through a mask having openings by means of an exposure apparatus UX-4023 (product name) manufactured by Ushio Inc. Then, a 1% aqueous sodium carbonate solution was used to develop and form a photosensitive negative resist film having openings. The photosensitive negative resist film having openings was aligned and bonded to a second surface on the head substrate 1 having the second etching mask 14' by means of a roll laminator to form a shield 11'.

Then, AMS200 (product name) manufactured by Alcatel-Lucent Corporate was applied from above the second etching mask 14'. More specifically, the Bosch process was used to etch the substrate 1 until the silicon oxide film 12 that is an etching stop layer to form supply ports 5.

Then, OBC (product name) as the protection layer 9 was removed with xylene. Then, the entire ink repellent layer was exposed from above with an exposure dose of 7000 mJ/cm$^2$ by means of a Deep-UV exposure apparatus UX-3000 (product name) manufactured by Ushio Inc., to solubilize the flow path structure 6. Then, the flow path structure 6 was dipped into methyl lactate and ultrasonic waves were applied to remove the flow path structure 6 to produce a liquid ejection head.

Example 4

As Example 4 according to the second embodiment, a liquid ejection head was produced by the liquid ejection head producing method illustrated in FIGS. 6A to 6I.

There was prepared a head substrate 1 having the (100) surface and including a liquid ejection energy generating element 16, a flow path structure 6, an ejection orifice 2 formed using a liquid flow path wall 7, and a liquid repellent layer 8.

First, OBC (product name) manufactured by Tokyo Ohka Kogyo Co., Ltd., was applied as a protection layer 9 to the entire liquid repellent layer 8 (FIGS. 6A and 6B). Then, a polyether amide resin HIMAL (product name) manufactured by Hitachi Chemical Co., Ltd., was applied to form an etching resistant film 13 on a rear surface of the substrate.

Figure 6C:
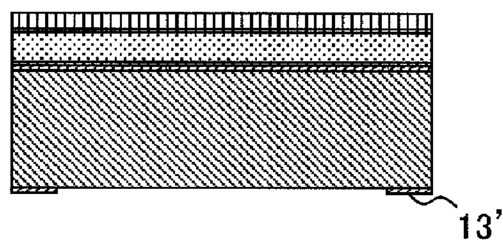

Then, a photosensitive positive resist OFPR-800 (product name) manufactured by Tokyo Ohka Kogyo Co., Ltd., was applied to the entire etching resistant film 13. A slit-shaped supply port pattern was formed on the applied positive resist by means of a Deep-UV exposure apparatus UX-3000 (product name) manufactured by Ushio Inc. Then, a combined gas of $CF_4$ and $O_2$ was used to perform chemical dry etching on the positive resist to form a first etching mask 13' (FIG. 6C).

Then, as illustrated in FIG. 6D, a guide hole 17 was formed by laser into a grid shape having a diameter of 50 μm, a pitch interval of 50 μm, and a depth of 400 μm.

Then, the first etching mask 13' was used as a mask to dip the silicon substrate in a tetramethylammonium hydroxide aqueous solution at 80° C. to be subjected to anisotropic etching to form a common liquid chamber 4 (FIG. 6E). Note that the anisotropic etching was performed by calculating the etching rate so that the remaining thickness of the substrate in a lower portion of the common liquid chamber was 130 μm when the silicon substrate was dipped in the aqueous solution.

Figure 6F:
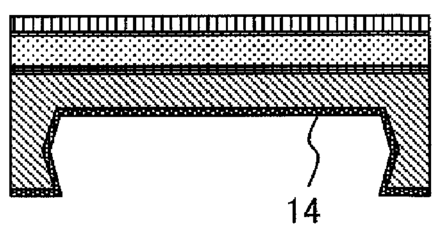

Then, the first etching mask 13' was removed. Then, a photosensitive positive resist layer 14 was formed on the surface subjected the anisotropic etching by means of a spray coater (manufactured by EV Group Co.). As the photosensitive positive resist, AZ-P4620 (product name) manufactured by AZ Electronic Materials was used. The resist was applied by heating the substrate chuck so that the substrate is maintained at 60° C. during spray coating (FIG. 6F).

Figure 6G:
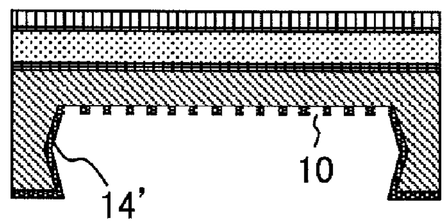

Then, the photosensitive positive resist 14 was exposed with an exposure dose of 1000 mJ/cm$^2$ through the supply port pattern mask by means of a projection exposure apparatus UX-4023 (product name) manufactured by Ushio Inc. Here, the position to be exposed was the bottom portion of the supply ports formed by anisotropic etching. Accordingly, the exposure focus position was set to be lower by the anisotropic etching depth. Then, a 2.38% tetramethylammonium hydroxide aqueous solution was used to develop and form a second etching mask 14' having a pattern opening 10 including fine supply ports on the bottom surface of the common liquid chamber (FIG. 6G).

Figure 6I:
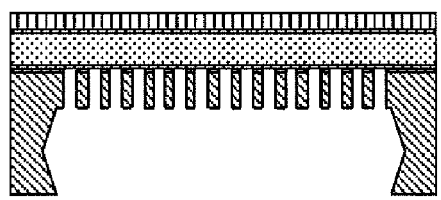
Figure 6H:
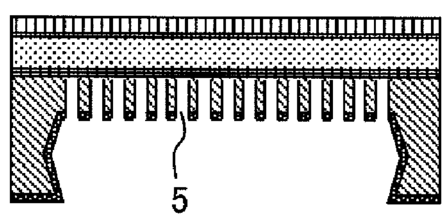
Figure 7:
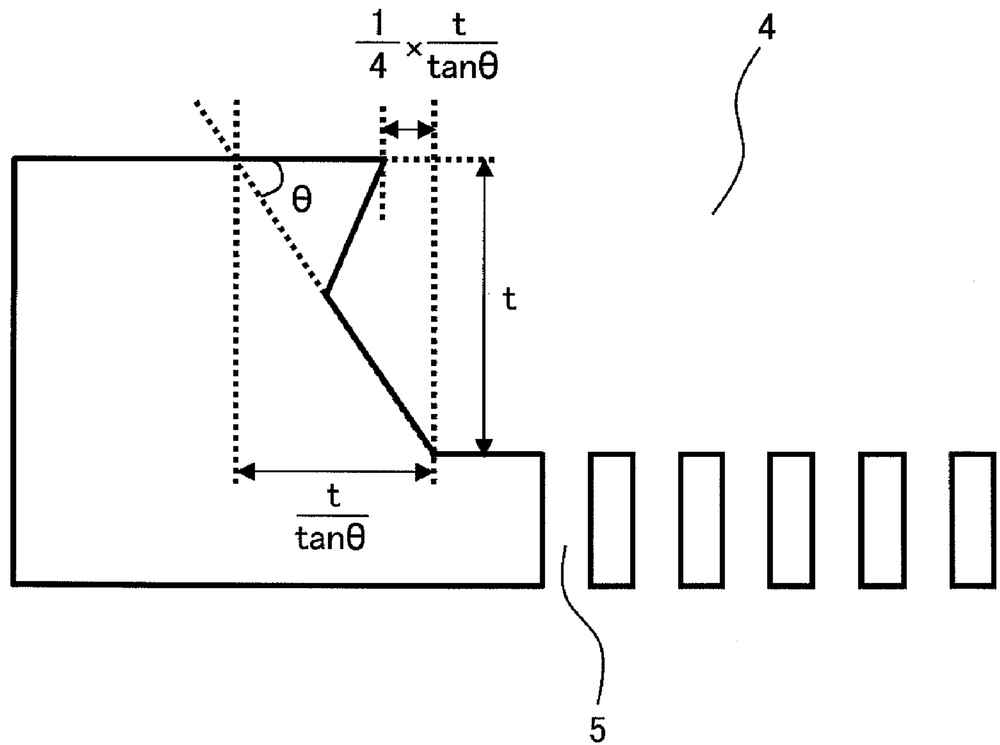
FIG. 7 is a schematic drawing for describing a preferred layout of an eaves-shaped portion of the first depressed portion according to the second embodiment.

Then, AMS200 (product name) manufactured by Alcatel-Lucent Corporate was applied from above the second etching mask 14'. More specifically, the Bosch process was used to dry-etch the head substrate 1 until the silicon oxide film 12 to form supply ports 5 (FIG. 6H).

Then, the silicon oxide film 12 as the etching stop layer was removed by means of a buffered hydrofluoric acid 110U (product name) manufactured by Daikin Industries, Ltd. (FIG. 6I).

Then, the second etching mask 14' was subjected to oxygen plasma asking and then removed by a remover solution. Then, OBC (product name) as the protection layer was removed with xylene. Then, the entire liquid repellent layer 8 was exposed from above with an exposure dose of 7000 mJ/cm$^2$ by means of a Deep-UV exposure apparatus UX-3000 (product name) manufactured by Ushio Inc., to solubilize the flow path structure 6. Then, the flow path structure 6 was dipped into methyl lactate and ultrasonic waves were applied to remove the flow path structure 6 to produce a liquid ejection head.

Example 5

As Example 5 according to the third embodiment, a liquid ejection head was produced by the liquid ejection head production method illustrated in FIGS. 14A to 14H.

First, a photosensitive positive resist OFPR-800 (product name) manufactured by Tokyo Ohka Kogyo Co., Ltd., was applied to the entire first silicon substrate 1101 with a thickness of 500 μm. A common liquid chamber pattern was formed on the applied positive resist by means of a Deep-UV exposure apparatus UX-4023 (product name) manufactured by Ushio Inc. Then, AMS200 (product name) manufactured by Alcatel-Lucent Corporate was used to apply the Bosch process to etch the first silicon substrate 1101 to form a common liquid chamber 1102. The depth of the common liquid chamber was 400 μm at the deepest portion so as not to pass through the first silicon substrate 1101.

Then, a photosensitive positive resist OFPR-800 (product name) manufactured by Tokyo Ohka Kogyo Co., Ltd., was applied to the entire second silicon substrate 1103 with a thickness of 625 μm having a 7000-angstrom thermal oxide film (0.7 μm) on the surface thereof. A supply port pattern was formed on the applied positive resist by means of a Deep-UV exposure apparatus UX-4023 (product name) manufactured by Ushio Inc. Then, a buffered hydrofluoric acid 110U (product name) manufactured by Daikin Industries, Ltd., was used to etch the thermal oxide film and form a supply port pattern mask.

Figure 14A:
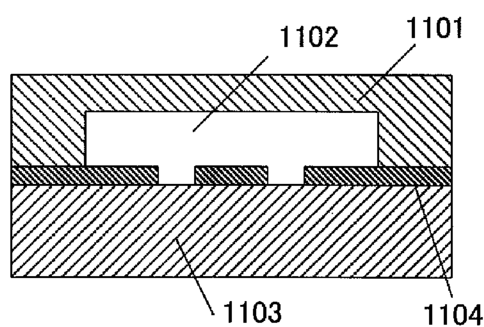
FIGS. 14A, 14B, 14C, 14D, 14E, 14F, 14G and 14H are process views for describing a processing method of Example 5.
Figure 14B:
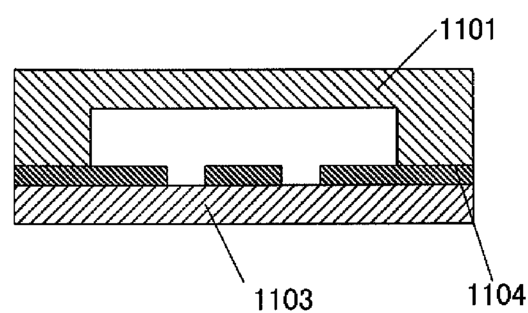
Figure 14C:
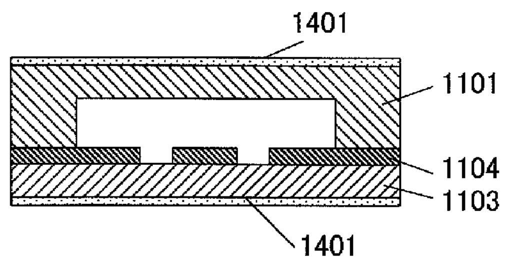

Then, a thermal oxide film having a supply port pattern formed on the second silicon substrate 1103 was used as the intermediate layer to bond the first silicon substrate 1101 to the second silicon substrate 1103 (FIG. 14A). The bonding surface of the first silicon substrate 1101 was a surface having an opening side of the common liquid chamber 1102. A bonding system EVG520IS (product name) manufactured by EV Group Co. was used to perform fusion bonding between silicon and the thermal oxide film. Then, the second silicon substrate 1103 was ground and polished until the thickness of the second silicon substrate 1103 was 50 μm (FIG. 14B). Further, the entire bonded substrate was subjected to thermal oxidation to form a thermal oxide film 1401 with a thickness of 2000 angstrom (FIG. 14C).

Figure 14D:
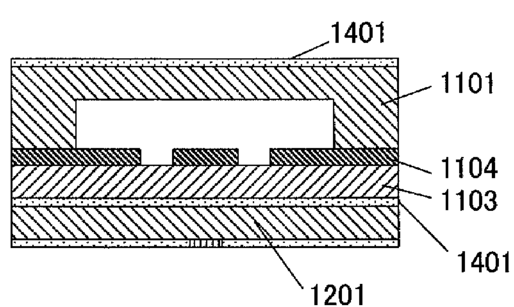
Figure 14E:
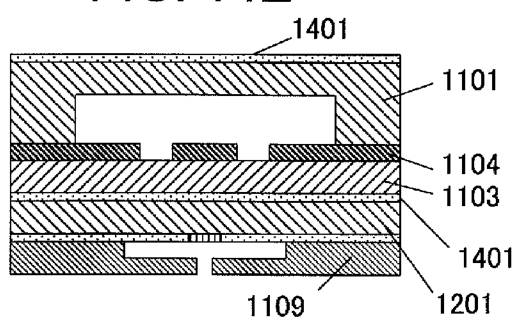

The substrate 1201 having a liquid ejection energy generating element was ground and polished until the thickness thereof was 100 μm, starting from the surface on the side not having the liquid ejection energy generating element. Then, the polished surface of the third silicon substrate 1201 having a liquid ejection energy generating element was fusion-bonded to the polished surface of the second silicon substrate 1103 by means of a bonding system EVG520IS (product name) manufactured by EV Group Co. (FIG. 14D). Then, a flow path forming layer 1109 was formed on the side of the third silicon substrate 1201 having a liquid ejection energy generating element (FIG. 14E).

Figure 14F:
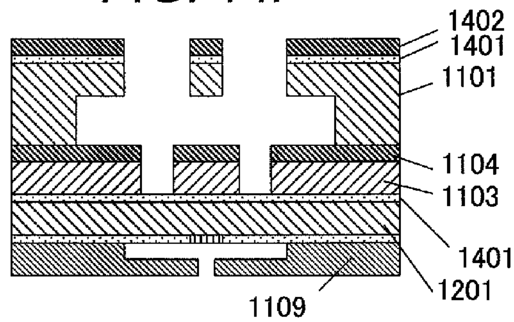

Then, a photosensitive positive resist 1402 OFPR-800 (product name) manufactured by Tokyo Ohka Kogyo Co., Ltd., was applied to the entire first silicon substrate 1101. A pattern including a supply port was formed on the applied positive resist by means of a Deep-UV exposure apparatus UX-4023 (product name) manufactured by Ushio Inc. Then, a buffered hydrofluoric acid 110U (product name) manufactured by Daikin Industries, Ltd., was used to etch the thermal oxide film 1401. Then, AMS200 (product name) manufactured by Alcatel-Lucent Corporate was used to apply the Bosch process to pass through the first silicon substrate 1101. Then, the Bosch process was used to form supply ports on the second silicon substrate (FIG. 14F).

Figure 14G:
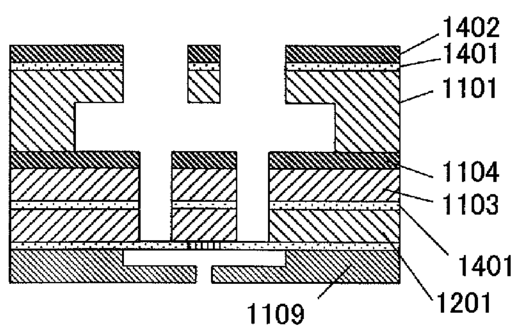
Figure 14H:
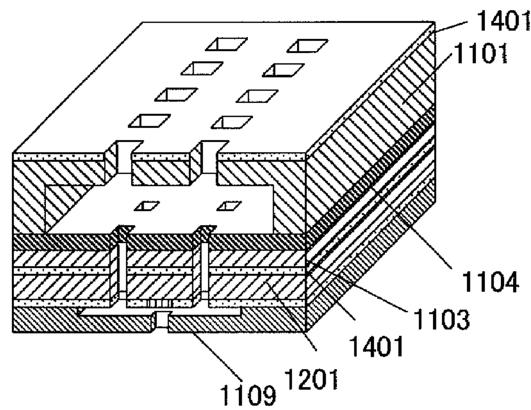

The thermal oxide film interposed between the second silicon substrate and the substrate having a liquid ejection energy generating element was removed by means of a buffered hydrofluoric acid 110U (product name) manufactured by Daikin Industries, Ltd. Further, the Bosch process was used to form supply ports on the substrate having a liquid ejection energy generating element (FIG. 14G). FIG. 14H is a perspective view after process completion.

The surface protection of the substrate having a liquid ejection energy generating element, the removal of the etching stop layer, and the removal of the protection layer are the same as Examples 1 to 4 and thus the description thereof is omitted.

Example 6

As an example 6 according to the fourth embodiment, a liquid ejection head was produced by the liquid ejection head production method illustrated in FIGS. 15A to 15E.

First, a photosensitive positive resist OFPR-800 (product name) manufactured by Tokyo Ohka Kogyo Co., Ltd., was applied to the entire first silicon substrate 1501 with a thickness of 500 μm having a 7000-angstrom thermal oxide film on the surface thereof. A supply port pattern was formed on the applied positive resist by means of a Deep-UV exposure apparatus UX-4023 (product name) manufactured by Ushio Inc. Then, a buffered hydrofluoric acid 110U (product name) manufactured by Daikin Industries, Ltd., was used to etch the thermal oxide film and form a supply port pattern mask 1504 (FIG. 15A).

Then, a second silicon substrate 1502 having a liquid ejection energy generating element was thinned to a thickness of 200 μm and then the surface was ground and polished. Then, the first silicon substrate 1501 was bonded to the second silicon substrate 1502 with a thermal oxide film 1503 having a supply port pattern as an intermediate layer sandwiched therebetween (FIG. 15B). The bonding process was based on those in Example 5. Then, a flow path forming layer 1510 was formed on the side of the second silicon substrate 1502 having a liquid ejection energy generating element.

Then, a photosensitive positive resist OFPR-800 (product name) manufactured by Tokyo Ohka Kogyo Co., Ltd., was applied to the entire first silicon substrate 1501. A common liquid chamber pattern 1505 was formed on the applied positive resist by means of a Deep-UV exposure apparatus UX-4023 (product name) manufactured by Ushio Inc. Dummy patterns 1506 are also included therein (FIG. 15C).

Then, AMS200 (product name) manufactured by Alcatel-Lucent Corporate was used to apply the Bosch process to form a common liquid chamber 1506 in the first silicon substrate 1501. Then, the Bosch process was used to form supply ports 1507 on the second silicon substrate (FIG. 15D). FIG. 15E is a perspective view after process completion.

The surface protection of the substrate having a liquid ejection energy generating element, the removal of the etching stop layer, and the removal of the protection layer are the same as in Examples 1 to 5 and thus the description thereof is omitted.

The processing method of a silicon substrate according to the present invention can form the second opening formed in the first opening in a more vertical manner. Thus, the opening positional accuracy of the second opening can be improved and high reliability can be secured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-167909, filed Jul. 27, 2010, which is hereby incorporated by reference herein in its entirety.

What is claimed is:

1. A processing method of a silicon substrate including a first surface side and a second surface side opposite to the first surface side, said method comprising the steps of:

(1) forming a first depressed portion on the second surface side of the silicon substrate;

(2) forming a patterning mask having a pattern opening on a bottom surface of the first depressed portion;

(3) forming a shield structure that extends in parallel with the second surface side of the silicon substrate so as to partially cover an opening of the first depressed portion on the second surface side of the silicon substrate; and (4) forming a second depressed portion by performing reactive ion etching from the second surface side of the silicon substrate.

2. The method according to claim 1, wherein the first depressed portion is formed on the second surface side such that an angle between a side surface and a bottom surface thereof is obtuse, and wherein the shield structure is made of a shield formed on the silicon substrate, and a shadow of the shield formed by irradiation of light perpendicular to the second surface side toward the first depressed portion covers at least part of the side surface but does not cover the pattern opening.

3. The method according to claim 2, wherein the shield is formed such that the shadow covers an entire of the side surface.

4. The method according to claim 2, wherein the shield is formed such that the shadow covers a part of the side surface.

5. The method according to claim 4, wherein an opening surface of the first depressed portion has a rectangular shape, and wherein in any cross section of a plane perpendicular to a surface direction of the silicon substrate and parallel to one side of the first depressed portion, the shield is formed in a range A expressed by the following expression in the surface direction from an end portion of the opening surface of the second surface side:

$$3t/4 \tan \theta \leq A \leq t/\tan \theta$$

where A is the distance from the end portion of the opening surface to the end portion of the shield, t is a depth of the first depressed portion, and θ is the angle between the opening surface and the side surface and ranges $0° < \theta < 90°$.

6. The method according to claim 1, wherein the first depressed portion is formed by crystal anisotropic etching.

7. The method according to claim 1, wherein the shield is made of a resist mask.

8. The method according to claim 7, wherein the shield is formed of a film photosensitive resist that is applied to the second surface and is patterned by photolithography.

9. The method according to claim 7, wherein the shield is formed by attaching a structure patterned into a shape of the shield to the second surface side.

10. The method according to claim 1, wherein the first depressed portion has a first cross section whose opening area is larger than an opening surface of the first depressed portion and largest among cross sections of the first depressed portion, in the direction parallel to a surface direction of the silicon substrate, wherein the first cross section is located between the opening surface and the bottom surface, wherein an angle between the bottom surface and a first side surface from the bottom surface to the first cross section is an obtuse angle, and wherein a silicon substrate portion forming a second side surface from the first cross section to the opening surface functions as the shield structure.

11. The method according to claim 10, wherein the first depressed portion is formed by forming a guide hole on the second surface side and then performing crystal anisotropic etching.

12. The method according to claim 11, wherein the guide hole is formed by laser.

13. The method according to claim 11, wherein the guide hole is formed by dry etching.

14. The method according to claim 10, wherein the first depressed portion has such a shape that a shadow formed by irradiation of light perpendicular to the second surface side toward the first depressed portion covers at least part of the first side surface but does not cover the pattern opening.

15. The method according to claim 14, wherein the first depressed portion is formed such that the shadow covers the entire first side surface.

16. The method according to claim 14, wherein the opening surface has a rectangular shape, and wherein in any cross section of a plane perpendicular to the surface direction and parallel to one side of the opening surface, an end portion of the shadow formed on the first side surface is located in a range from the end portion of the bottom surface up to $t/4 \tan \theta$ in the surface direction, where t is a depth of the first depressed portion, and θ is an angle between the opening surface and the first side surface.

17. The method according to claim 1, wherein the silicon substrate has a <100> crystal orientation.

18. The method according to claim 1, wherein the reactive ion etching is performed using a Bosch process.

19. A process for producing a liquid ejection head comprising forming a supply port as the second depressed portion on a bottom surface of a common liquid chamber as the first depressed portion using the method according to claim 1.

20. A processing method of a stacked silicon substrate including a first silicon substrate with a first surface side and a second surface side opposite to the first surface side and a second silicon substrate with a first surface side and a second surface side opposite to the first surface side, said method comprising the steps of:

(1) forming a first depressed portion on the second surface side of the first silicon substrate;

(2) providing the second silicon substrate where the second silicon substrate is provided with an intermediate layer as a first patterning mask on the first surface side of the second silicon substrate;

(3) bonding the first silicon substrate and the second silicon substrate with the second surface side of the first silicon substrate and the intermediate layer on the first surface side of the second silicon substrate bonded together;

(4) forming a second patterning mask for forming a through-hole on the first surface side of the first silicon substrate, the second patterning mask being aligned with the first patterning mask and having a second pattern opening formed on the intermediate layer and arranged so as to include a position perpendicular to a surface direction of the second pattern opening;

(5) forming the through-hole reaching the first depressed portion in the first silicon substrate using the second patterning mask, the first depressed portion becoming the first opening; and (6) forming a second depressed portion as the second opening using the intermediate layer as a mask by means of the reactive ion etching performed from the through-hole.

21. The method according to claim 20, further comprising the step of bonding a third silicon substrate to the second silicon substrate after step (3).

22. The method according to claim 21, further comprising the step of thinning the second silicon substrate after step (3) and before the second silicon substrate is bonded to the third silicon substrate.

23. The method according to claim 20, further comprising the step of forming a silicon oxide film in the first depressed portion after step (1) and before step (3).

24. The method according to claim 20, further comprising the step of forming an opening portion communicatively connected to the first opening on the first surface side of the first silicon substrate after step (6).

25. The method according to claim 20, wherein a Bosch process is used as the reactive ion etching.

26. The method according to claim 20, wherein the intermediate layer is at least any one of a resin layer, a silicon oxide film, a silicon nitride film, a silicon oxynitride film and a silicon carbide film.

27. A process for producing a liquid ejection head including the method according to claim 20.

28. The process according to claim 27 further comprising the step of:

forming a flow path forming layer forming an ejection orifice for ejecting a liquid and a liquid flow path communicatively connected to the ejection orifice on a second surface side of the second silicon substrate, wherein the first opening is a common liquid chamber, and the second opening is a supply port communicatively connected to the common liquid chamber and the liquid flow path.

29. A processing method of a stacked silicon substrate including a first silicon substrate with a first surface side and a second surface side opposite to the first surface side and a second silicon substrate with a first surface side and a second surface side opposite to the first surface side, said method comprising the steps of:

(1) bonding the first silicon substrate at the second surface side thereof and the second silicon substrate at the first surface side thereof via an intermediate layer which is a first patterning mask;

(2) forming a second patterning mask for forming a first opening and a dummy structure on the first surface side of the first silicon substrate, the second patterning mask including a side wall pattern for forming an outer wall of the first opening and a dummy pattern for forming the dummy structure, and the dummy pattern being located in the side wall pattern and in a region other than a position perpendicular to a surface direction of a pattern opening formed in the intermediate layer;

(3) forming the first opening and the dummy structure by dry etching until the intermediate layer using the second patterning mask; and (4) forming a second opening by reactive ion etching using the intermediate layer as a mask.

30. The method according to claim 29, wherein the intermediate layer is at least any one of a resin layer, a silicon oxide film, a silicon nitride film, a silicon oxynitride film and a silicon carbide film.

31. A production process for a liquid ejection head including the method according to claim 29.

32. The process according to claim 31, further comprising the step of:

forming a flow path forming layer forming an ejection orifice for ejecting a liquid and a liquid flow path communicatively connected to the ejection orifice on a second surface side of the second silicon substrate, wherein the first opening is a common liquid chamber, and the second opening is a supply port communicatively connected to the common liquid chamber and the liquid flow path.

* * * * *